(12) United States Patent
Ooishi

(10) Patent No.: US 7,286,394 B2
(45) Date of Patent: Oct. 23, 2007

(54) NON-VOLATILE SEMICONDUCTOR MEMORY DEVICE ALLOWING CONCURRENT DATA WRITING AND DATA READING

(75) Inventor: Tsukasa Ooishi, Hyogo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 0 days.

(21) Appl. No.: 11/179,892

(22) Filed: Jul. 13, 2005

(65) Prior Publication Data

US 2006/0077737 A1 Apr. 13, 2006

(30) Foreign Application Priority Data

Jul. 14, 2004 (JP) .............................. 2004-207619

(51) Int. Cl.
*G11C 11/00* (2006.01)

(52) U.S. Cl. .................................. 365/158; 365/189.04

(58) Field of Classification Search ................ 365/158, 365/189.04
See application file for complete search history.

(56) References Cited

U.S. PATENT DOCUMENTS

| 6,549,455 | B2 | 4/2003 | Yamada |
| 6,693,824 | B2* | 2/2004 | Nahas et al. ................. 365/158 |
| 6,879,513 | B2 | 4/2005 | Ooishi |
| 7,057,919 | B1* | 6/2006 | Jenne et al. ................. 365/158 |
| 7,068,530 | B2* | 6/2006 | Hayashi ....................... 365/158 |
| 7,095,648 | B2* | 8/2006 | Ditewig et al. ............. 365/158 |

FOREIGN PATENT DOCUMENTS

| JP | 2003-249629 | 9/2003 |
| JP | 2004-348836 | 12/2004 |
| JP | 2004-348891 | 12/2004 |
| JP | 2005-025893 | 1/2005 |

OTHER PUBLICATIONS

Durlam et al., "A 0.18 μm 4Mb Toggling MRAM", 2003 IEEE International Electron Devices Meeting, Published in IEDM Technical Digest 2003, Session 34, paper #0, Dec. 2003, pp. 1-3.

\* cited by examiner

*Primary Examiner*—Hoai V. Ho
(74) *Attorney, Agent, or Firm*—Buchanan Ingersoll & Rooney PC

(57) ABSTRACT

A write bit line and a read bit line are provided separately for a memory cell. A source line connecting to the memory cell is formed of a source impurity region the same in conductivity type as a substrate region. A memory cell transistor and the source impurity region are connected by a metal interconnection line of a low resistance. A rise in the source line potential can be prevented, and a memory cell current can reliably be generated according to storage data. Further, fast data reading can be achieved. Additionally, by performing precharging and data amplification in a unit of read bit line, the load of the read bit line can be alleviated to achieve fast reading. An accessing time of a non-volatile semiconductor memory device that uses a variable resistance element as a storage element is reduced without increasing the current consumption.

2 Claims, 24 Drawing Sheets

WCSL MAY BE ACTIVE IN WRITE CYCLE AND ACTIVATION
PERIOD MAY BE SET BY WRITE CLOCK

NON-VOLATILE SEMICONDUCTOR MEMORY DEVICE ALLOWING CONCURRENT DATA WRITING AND DATA READING

BACKGROUND OF THE INVENTION

1. Field of the Invention

The present invention relates to a non-volatile semiconductor memory device, and particularly, to a configuration for reducing a time required for data writing/reading in a non-volatile semiconductor memory device. Specifically, the present invention relates to an array configuration for and an accessing scheme for fast accessing of a non-volatile semiconductor memory device containing a variable resistance element, such as a magneto-resistance element or a phase change element, as a storage element.

2. Description of the Background Art

Among semiconductor memory devices that store data in a non-volatile manner, there is included a magnetic semiconductor memory device (MRAM: Magnetic Random Access Memory) that utilizes a tunnel junction (MTJ: Magnetic Tunnel Junction) structure exhibiting a tunneling magneto-resistance (TMR) effect as a storage element.

In a TMR element (or an MTJ element), a storage element is structured by two magnetic layers with an insulating layer (a tunneling barrier layer) interposed in between. Normally, one of the two magnetic layers is formed with an antiferromagnetic layer having its magnetization direction fixed, and the other magnetic layer has its magnetization direction changed in accordance with write data. Depending on the relationship between the magnetization directions of the fixed layer having the fixed magnetization direction and of the free layer having the magnetization direction changed in accordance with write data, the tunneling resistance of the tunneling barrier film changes due to magneto-resistance effect. Specifically, the magneto-resistance becomes the lowest when the magnetization directions of the free layer and the fixed layer are parallel, and the magneto-resistance becomes the highest when the magnetization directions of the free layer and the fixed layer are anti-parallel or opposite. These magneto-resistance values are correlated with "1" and "0" of storage data. As data is stored by the magnetization direction and the magnetization direction is retained until a magnetic field is newly applied externally, data can be stored in a non-volatile manner.

As an amount of current flowing through the TMR element changes in accordance with a magneto-resistance value, data reading is performed by determining storage data in accordance with the magnitude of the current value.

An exemplary configuration of such a magnetic semiconductor memory device is shown in Prior Art Reference 1 (Japanese Patent Laying-Open No. 2003-249629).

In the configuration shown in Prior Art Reference 1, storage elements formed of magneto-resistance elements such as TMR elements are arranged in rows and columns, and one read block is constructed by a prescribed number of memory cells. In the read block, first ends of the TMR elements are individually connected to respective bit lines, and the opposite second ends of the TMR elements are coupled to a source line via a common read select switch. Prior Art Reference 1 intends to reduce the occupying area of the memory cells by connecting one read select switch to a plurality of TMR elements, as compared to the configuration where a select transistor is arranged for each memory cell. Additionally, in data reading, it is intended to achieve fast data reading, by selectively driving a bit line and a read select switch so that a read current is caused to flow through only one memory cell.

In the configuration shown in Prior Art Reference 1, in one read block, TMR elements are respectively connected to different read bit lines, and a source line is commonly connected to the read blocks aligned in a direction perpendicular to the read bit lines. To one read block, one read select gate is connected, and a plurality of TMR elements in one read block are connected commonly to a source line. With this configuration, it is intended to read storage data of TMR elements in the read block in parallel simultaneously.

However, when a source line is provided commonly to a plurality of read blocks and the interconnection resistance of the source line is large, such a problem occurs that a read current (memory cell current) from a selected memory cell (TMR element) flows to raise the source line potential (in data reading, the source line is coupled to the ground potential), the read current cannot be sufficiently supplied, and fast data reading cannot be achieved. Further, due to the raised source line potential, the memory cell current may be limited and correct data reading may not be performed.

In order to reduce the resistance of the source line, the following approach may be considered. That is, a source line is formed of, for example, an N type impurity layer and a low resistance layer such as cobalt silicide (CoSi) layer is formed on the surface of the source impurity layer, to achieve the reduction in the resistance of the source line contact and the interconnection resistance of the source line. However, with such a configuration, it is still inadequate to obtain a correct read current, due to the interconnection resistance and the distribution of the source potential (floating-up) over the entire source line as the source line is arranged extending along a plurality of read blocks and thus the interconnection length is large.

Further, in the configuration shown in Prior Art Reference 1, a write word line driven to a selected state in data writing and a read bit line driving a memory cell current in data reading are formed of a common interconnection line. With the common configuration of the write word line and read bit line, it is intended to simplify the array configuration. Accordingly, a read bit line cannot be used in data writing, and conversely, a write word line cannot be used in data reading. Thus, it is allowed to alternatively perform data writing and data reading, and it is not allowed to implement an operation mode performing writing and reading in parallel, such as read-modify-write mode in which write data is changed by read data.

Still further, in the configuration shown in Prior Art Reference 1, a read bit line is connected to an internal data line that is connected to a read sense amplifier. From a read circuit including the read sense amplifier, a read current is supplied to a selected read bit line. As the write word line and the read bit line are formed into a common line, a write word line driver and the read sense amplifier are both connected to the internal data line. Accordingly, there are problems that the load of the internal data line is large, the read current cannot be driven fast in data reading, and fast accessing cannot be achieved. Particularly, in data reading, the internal data line, to which the sense amplifier is connected, is directly driven by a memory cell current, and the memory cell current is required to drive the internal data line with a large load. Therefore, there is a problem that fast reading cannot be achieved.

SUMMARY OF THE INVENTION

An object of the present invention is to provide a non-volatile semiconductor memory device that can reduce an accessing time.

Another object of the present invention is to provide a non-volatile semiconductor memory device that can implement an operation mode similar to that in another memory device such as a dynamic random access memory (DRAM).

A specific object of the present invention is to provide a non-volatile semiconductor memory device having a variable resistance element type memory cell structure, which can reduce an accessing time without increasing the current consumption.

A non-volatile semiconductor memory device according to a first aspect of the present invention includes: a plurality of non-volatile memory cells, arranged in rows and columns, each storing information in a non-volatile manner; a plurality of bit lines, arranged corresponding to the respective columns of memory cells, each connecting to memory cells of a corresponding column; a plurality of bit line precharge circuits, arranged corresponding to the respective bit lines, each for supplying a prescribed precharge potential to a corresponding bit line; a plurality of bit line amplifier circuits, arranged corresponding to the bit lines, each for amplifying a potential of a corresponding bit line and transmitting the amplified potential to an internal data line; and read activation control circuitry for selectively activating, in selection of a column, the bit line amplifier circuit and bit line precharge circuit of a selected column such that a current flowing through a selected memory cell can be amplified.

A non-volatile semiconductor memory device according to a second aspect of the present invention includes: a plurality of non-volatile memory cells, arranged in rows and columns, each having physical state thereof set according to storage information to store information in a non-volatile manner; a write circuit for supplying, in data writing, a write current to a write target memory cell among the memory cells to perform data writing to the selected, write target memory cell; and a read circuit for performing data reading from a read target memory cell among the plurality of non-volatile memory cells. The read circuit is operable in parallel to the write circuit.

A non-volatile semiconductor memory device according to a third aspect of the present invention includes: a plurality of non-volatile memory cells, arranged in rows and columns, each storing information in a non-volatile manner; and a plurality of conductive lines, arranged corresponding to the respective columns of memory cells, each for forming a current path in reading data for a memory cell of a corresponding column. Each of the plurality of conductive lines has an impurity region identical in conductivity type to a substrate region where the memory cells of the corresponding column are formed.

In the non-volatile semiconductor memory device according to the first aspect, a precharge circuit and an amplifier circuit are arranged for each bit line, and a memory cell current is not required to directly drive an internal data line. The capacitance driven by the memory cell current flowing through a selected memory cell can be reduced, and internal data reading can be performed at high speed. Accordingly, a read accessing time can be reduced.

In the non-volatile semiconductor memory device according to the second aspect, a write circuit performing data writing and a read circuit performing data reading are made operable concurrently. Thus, data writing and data reading can be performed in parallel. Two instructions of writing and reading can be executed concurrently, and a memory system achieving fast processing can be structured. Additionally, operation modes such as read-modify-write and write-verify can be implemented, and improvement in performance and reduction in write time can be achieved.

In the non-volatile semiconductor memory device according to the third aspect of the present invention, a conductive line for conducting a memory cell current is formed by an impurity layer having a conductivity type identical to that of a substrate region where the memory cells are formed. Accordingly, the memory cell current can be discharged to the substrate region and a rising in potential of the conductive line can be suppressed. Thus, the memory cell current can be sensed correctly.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
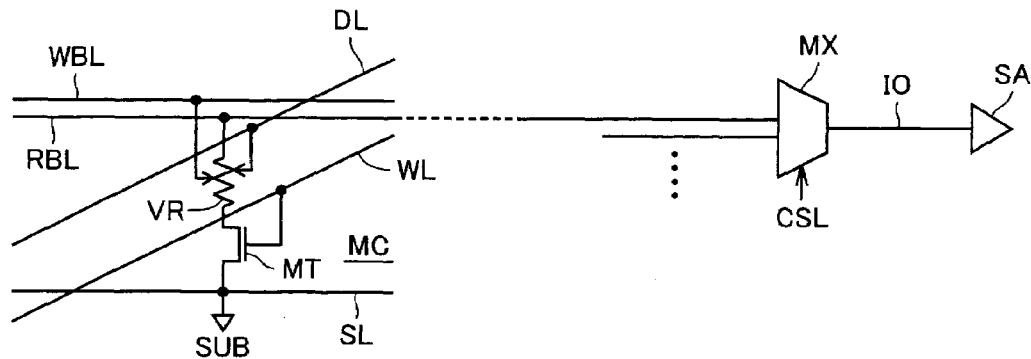
FIG. 1 schematically shows a configuration of a main portion of a magnetic semiconductor memory device according to a first embodiment of the present invention.

FIG. 1 schematically shows a configuration of a portion related to one memory cell of a non-volatile semiconductor memory device according to a first embodiment of the present invention. A memory cell MC is arranged corresponding to an intersection of a digit line DL as well as a word line WL and a write bit line WBL as well as a read bit line RBL. In the first embodiment, write bit line WBL for supplying a write current in data writing to memory cell MC, and read bit line RBL for supplying a read current to memory cell MC in data reading are separately provided.

Write bit line WBL and read bit line RBL are arranged in parallel, and word line WL and digit line DL are arranged in parallel.

Memory cell MC includes a variable resistance element VR having its resistance value set in accordance with storage information, and a select transistor MT for coupling variable resistance element VR to source line SL in accordance with a signal on word line WL. Variable resistance element VR is formed of, for example, an MTJ element (TMR element), and has its resistance value set in accordance with storage data. Specifically, the resistance value of variable resistance element VR is set in accordance with the magnetization direction of a free layer determined by a combined electric field induced by a current flowing through write bit line WBL and digit line DL in data writing.

As one example, select transistor MT is formed of an N channel MOS transistor (insulated gate field effect transistor), and couples, when selected, variable resistance element VR to source line SL.

Source line SL, of which structure will be described in detail later, is coupled to a semiconductor substrate region SUB where memory cell MC is formed, in a region to which select transistor MT is connected. Accordingly, a current flowing from read bit line RBL to source line SL flows into substrate region SUB, and a potential distribution due to the memory cell current over source line SL does not occur.

Read bit line RBL is coupled to internal data line IO through a multiplexer Mx that performs a select operation in accordance with a column select signal CSL. The current on internal data line IO is sensed by sense amplifier SA, and reading of internal data is performed. An output signal of sense amplifier SA is output as external data through an output buffer.

Figure 2:
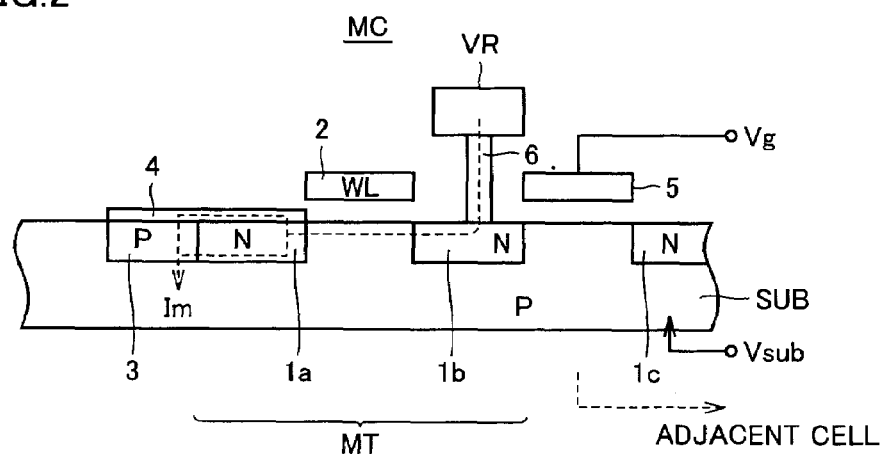
FIG. 2 schematically shows a cross-sectional structure of a memory cell of the magnetic semiconductor memory device according to the first embodiment of the present invention.

FIG. 2 schematically shows a cross-sectional structure of one memory cell. In FIG. 2, memory cell MC includes N type impurity regions 1*a* and 1*b* formed on a surface of P type semiconductor substrate region SUB, and a gate electrode 2 formed above the substrate region between impurity regions 1*a* and 1*b*. Gate electrode 2 constitutes a part of word line WL. On the surface of substrate region SUB, a P type impurity region 3 of the same conductivity type as substrate region SUB is formed adjacent to N type impurity region 1*a*. Impurity regions 1*a* and 3 are interconnected by a metal layer 4 of a low resistance, such as cobalt silicide (CoSi) layer.

Impurity region 1*b* is connected to variable resistance element VR via contact 6.

In an adjacent memory cell also, similarly, an N type impurity region 1*c* is formed on the surface of substrate region SUB. Impurity region 1*c* is connected to the variable resistance element via a contact, not shown. Between impurity regions 1*b* and 1*c*, on substrate region SUB, an isolation gate electrode 5 is arranged. Isolation gate electrode 5 is formed at the same interconnection layer as gate electrode 2 constituting word line WL (that is, formed with the same material in the same manufacturing step) and fixed to a constant bias voltage Vg. Bias voltage Vg is the voltage level that prevents a channel from being formed at the surface of substrate region SUB beneath isolation gate electrode 5, and it is the voltage level at the ground voltage or lower. Thus, adjacent memory cells are isolated from each other.

P type impurity region 3 has the same conductivity type as substrate region SUB, and is maintained at the same voltage Vsub as substrate region SUB. Upon selection of word line WL, a channel is formed between impurity regions 1*a* and 1*b*, and a memory cell current Im flows between impurity region s 1*b* and 1*a* from a read bit line via variable resistance element VR. Memory cell current Im is transmitted to P type impurity region 3 by low-resistance metal layer 4, and further, discharged to substrate region SUB via P type impurity region 3. Accordingly, as memory cell current Im is discharged to substrate region SUB, the source of a selected memory cell can reliably be maintained at the ground voltage level with voltage Vsub of substrate region SUB being at the ground voltage level.

Figure 3:
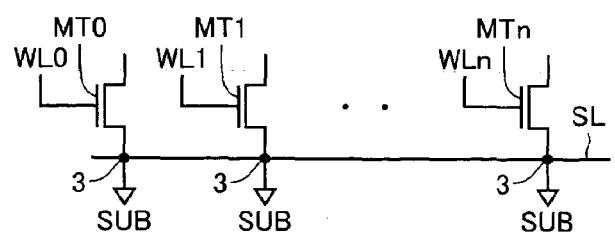
FIG. 3 schematically shows a connection to a source line of the memory cells according to the first embodiment of the present invention.

Accordingly, as shown in FIG. 3, even with a configuration where a plurality of memory cell select transistors MT0-MTn are connected to source line SL, and even when the source region of each select transistor MT0-MTn is connected to the substrate region via impurity region 3 and therefore the interconnection resistance over the entire source line SL is not negligible, memory cell current Im can reliably be set to a current amount corresponding to the resistance value of variable resistance element VR while suppressing a rise in the source potential. Thus, correct reading of memory cell data can be performed.

It is noted that, in the memory cell structure shown in FIG. 2, the impurity concentration of P type impurity region 3 may be set high. As impurity regions 1a and 3 are maintained at the same potential by low resistance metal layer 4 and memory cell current Im flows from a read bit line to a source line via low resistance metal layer 4, the memory cell current can reliably be discharged to substrate region SUB, even when the current does not flow via a PN junction between impurity regions 1a and 3 due to a built-in voltage of the PN junction between impurity regions 1a and 3.

Figure 4:
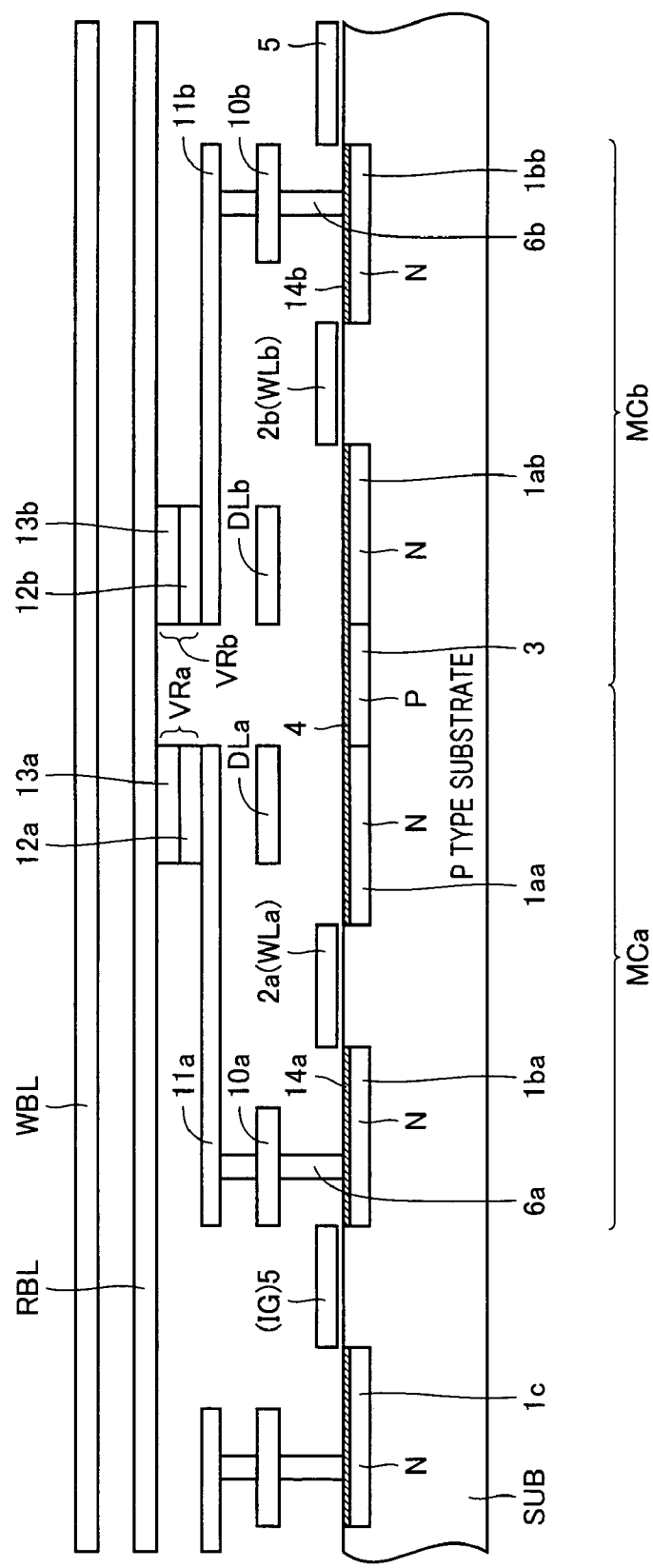
FIG. 4 schematically shows a cross-sectional structure of a memory cell array according to the first embodiment of the present invention.

FIG. 4 shows cross-sectional structure of memory cells of the non-volatile semiconductor memory device according to the first embodiment of the present invention in more detail. In FIG. 4, the structures for two memory cells MCa and MCb adjacent to each other in an extending direction of read bit line RBL (the column direction) are representatively shown.

Memory cell MCa includes N type impurity regions 1aa and 1ba formed on a surface of P type substrate region SUB, and a gate electrode 2a formed above the substrate region between impurity regions 1aa and 1ba. Gate electrode 2a constitutes a part of word line WLa.

Memory cell MCa further includes a contact 6a that is connected to impurity region 1ba via metal layer 14a that functions as a barrier metal and that reduces the contact resistance, a conductive pad 10a connected to contact 6a, a conductive strap 11a connected to pad 10a, and a variable resistance element VRa connected to conductive strap 11a.

Variable resistance element VRa is formed of a TMR element and includes a lower magnetic layer 12a connected to conductive strap 11a via a lower electrode, and an upper magnetic layer 13a connected to read bit line RBL via an upper electrode. Magnetic layers 12a and 13a form a fixed layer and a free layer, respectively. Above read bit line RBL, write bit line WBL is formed in parallel.

Below variable resistance element VRa, a digit line DLa formed at the same layer as pad 10a is arranged.

Memory cell MCb includes N type impurity regions 1ab and 1bb formed on P type substrate SUB surface, a gate electrode 2b, a contact 6b connected to N type impurity region 1bb via a metal layer 14b, a pad 10b connected to contact 6b, and a variable resistance element VRb connected to pad 10b via a conductive strap 11b. Variable resistance element VRb also includes a lower magnetic layer 12 electrically connected to conductive strap 11b and an upper magnetic layer 13b electrically connected to read bit line RBL. Variable resistance element VRb is also comprised of a TMR element.

On the surface of P type substrate region SUB between N type impurity regions 1aa and 1ab, P type impurity region 3 is formed. On the surfaces of impurity regions 1aa, 1ab and 3, metal layer 4 of cobalt silicide (CoSi) or the like is formed, whereby resistance of impurity regions 1aa, 1ab and 3 is reduced and impurity regions 1aa, 1ab and 3 are electrically connected. P type impurity region 3 is electrically connected by metal layer 4 formed thereon to impurity regions 1aa and 1ab of a memory cell select transistor, and functions as a source line and discharges a current from the memory cell to P type substrate region SUB.

Between impurity region lab and variable resistance element VRb, a digit line DLb is formed at the same layer as pad 10b.

Between N type impurity region 1c of the adjacent memory cell and N type impurity region 1ba of memory cell MCa, an isolation gate electrode 5 formed at the same layer as gate electrode 2a constituting a word line and others is arranged. By isolation gate electrode 5, a high potential barrier is formed between impurity regions 1c and 1ba, and N type impurity regions 1c and 1ba are electrically isolated. By utilizing such "field shield" cell isolation structure, it is not necessary to specially form a cell insulation region such as a cell isolation insulating film on the substrate region surface, and thus reduction in the size of a cell can be achieved.

By using P type impurity region 3 of the same conductivity type as P type substrate region SUB as a source line, the current flowing through memory cell MCa or MCb flows into P type substrate region SUB from N type impurity region 1aa or 1ab via metal layer 4 and P type impurity region 3, which prevents a rise in potential of the source line of memory cell MCa or MCb. Specifically, as shown in FIG. 3, in a case where memory cell select transistors MT0-MTn, which are selected by word lines WL0-WLn respectively, are connected to common source line SL also, they are connected to P type semiconductor substrate region SUB by corresponding P type impurity regions 3, whereby a rise in the source potential can be prevented.

Figure 5:
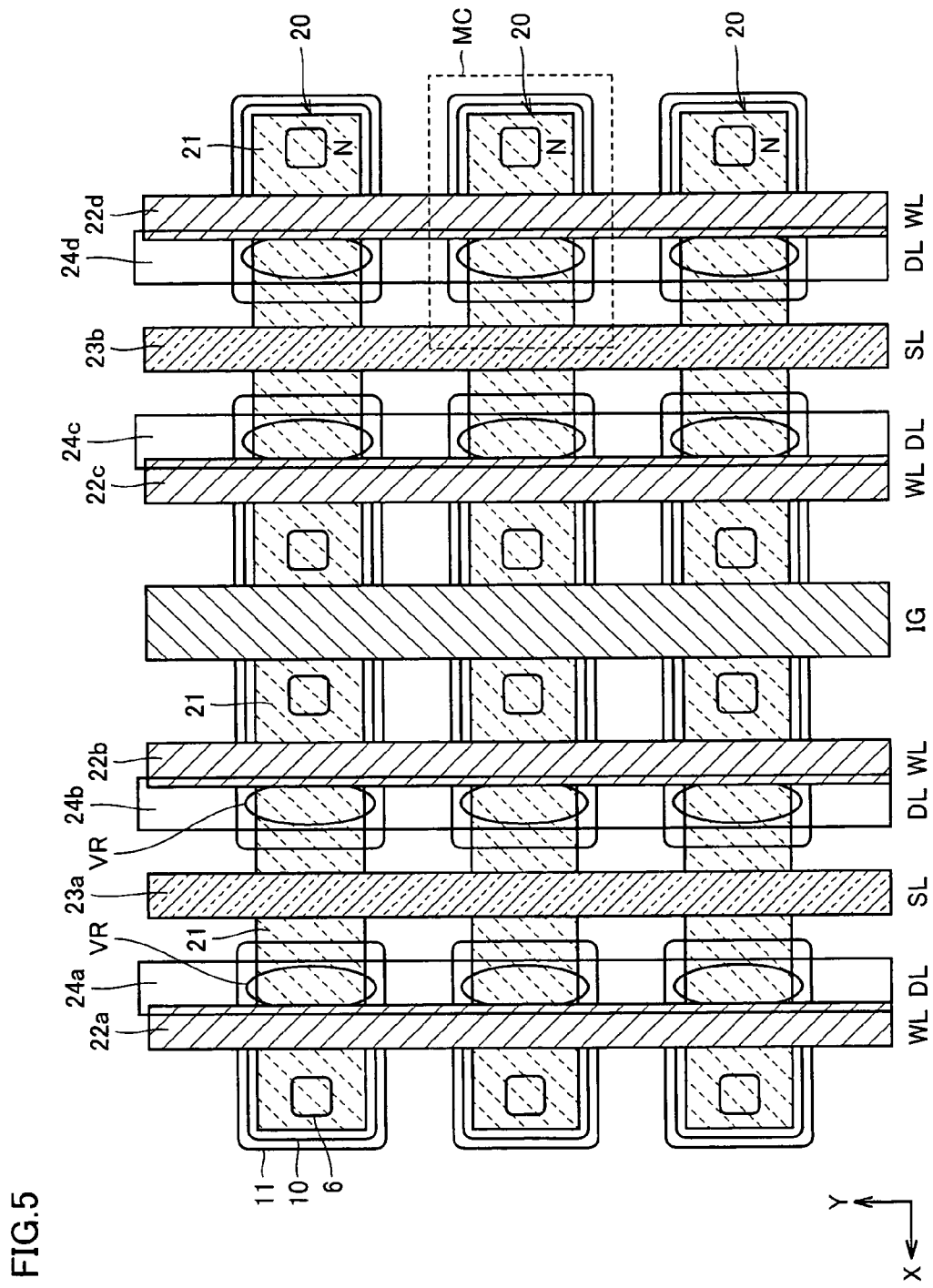
FIG. 5 schematically shows a two-dimensional layout of an array portion of the magnetic semiconductor memory device according to the first embodiment of the present invention.

FIG. 5 schematically shows the layout of a memory cell array according to the first embodiment of the present invention. In FIG. 5, memory cells MC are arranged aligned in X and Y directions. Active regions 20 forming memory cell transistors are arranged extending in an X direction in a strip-like form. Active regions 20 adjacent to each other in Y direction are isolated from each other by an isolation region such as a cell isolation film. In an active region 20, an N type impurity region 21 constituting source and drain regions of the transistor of the memory cell is formed.

Conductive layers 22a, 22b, 22c and 22d each forming word line WL are formed along Y direction and perpendicular to active regions 20. Between conductive layers 22a-22d each forming word line WL, P type impurity layer 23a forming source line SL and conductive layer 25 forming an insulation gate electrode layer IG for isolating adjacent memory cells are alternately arranged. P-type impurity layer 23a is continuously formed along Y direction on the semiconductor substrate region surface so as to cross active regions 20. In each active region, N type impurity region 21 is isolated by source line impurity layer 23a. Conductive layer 25 forming isolation gate electrode layer IG is formed at the same interconnection layer as conductive layers 22a-33d each forming word line WL (formed in the same manufacturing step).

In parallel to the conductive layers each forming word line WL, above word line WL, conductive layers 24a-24d each forming digit line DL are formed. Digit line conductive layers 24a-24d are formed extending continuously in Y direction, similarly to word line WL.

In memory cell MC, N type region 21 of active region 20 and pad 10 are electrically connected via contact 6, and contact 6 is electrically connected to strap 11 having a rectangular shape larger than pad 10. Strap 11 is connected to variable resistance element VR (MTJ element; TMR element) shown in an oval shape in the drawing. Variable resistance element VR is formed above digit line 24 (24a-

24*d*) and connected to read bit line RBL, although these read bit line RBL and write bit line WBL are not shown in FIG. 5.

The memory cells connected to conductive layers 22*a* and 22*b* each forming a word line share a source line by P type impurity layer 23*a* formed between them, and the memory cells connected to conductive layers 22*b* and 22*c* each forming a word line are electrically isolated by conductive layer 25 forming isolation gate IG electrode layer. Contacts formed on opposing sides of conductive layer 25 forming isolation gate electrode layer IG connect the corresponding N type impurity regions to corresponding variable resistance element VR via pad 10 and strap 11.

Memory cells connected respectively to conductive layers 22*c* and 22*d* share source line SL by P type impurity layer 23*b* formed between them.

By forming source lines by P type impurity layers 23*a* and 23*b*, the contact area between each source line and the substrate region (not shown in FIG. 5) can be increased, and rise in potential of the source lines can reliably be suppressed.

In addition, P type impurity layers 23*a* and 23*b* are interconnected via the substrate region, and therefore in the memory array, source lines are arranged in a meshed shape, to implement a configuration where source regions of memory cell transistors are connected together to share a source line.

Further, between adjacent memory cells, conductive layer 25 to be isolation gate electrode layer IG is arranged in the same layer as word line WL, whereby active region 20 can reliably be formed in a strip form in X direction to isolate memory cell transistors (N type impurity regions are formed in a self-aligned manner using conductive layers 24*a*-24*d* and 25 as masks). Thus, it is not necessary to isolate each cell individually, an edge effect of the impurity regions of transistors is not caused, and variations in characteristics of the memory cell transistors can be reduced. Specifically, active regions 20 each are formed into a strip-like shape and it is not necessary to provide a dedicated isolation region for cell isolation, whereby a reduction in size can be achieved and in addition, the edge effect in an edge region of transistors can be suppressed. Thus, variations in the characteristics of the transistors can further be reduced.

Still further, as read bit line RBL and write bit line WBL are separately provided and a write driver is not connected to the read bit line, the load of the read bit line can be alleviated, and the source potential can reliably be maintained at a prescribed potential level to obtain a correct memory cell current. By providing the read bit line and write bit line separately, data writing and data reading can be controlled individually and independently. The configuration of independent control of writing and reading will be described later.

Figure 6:
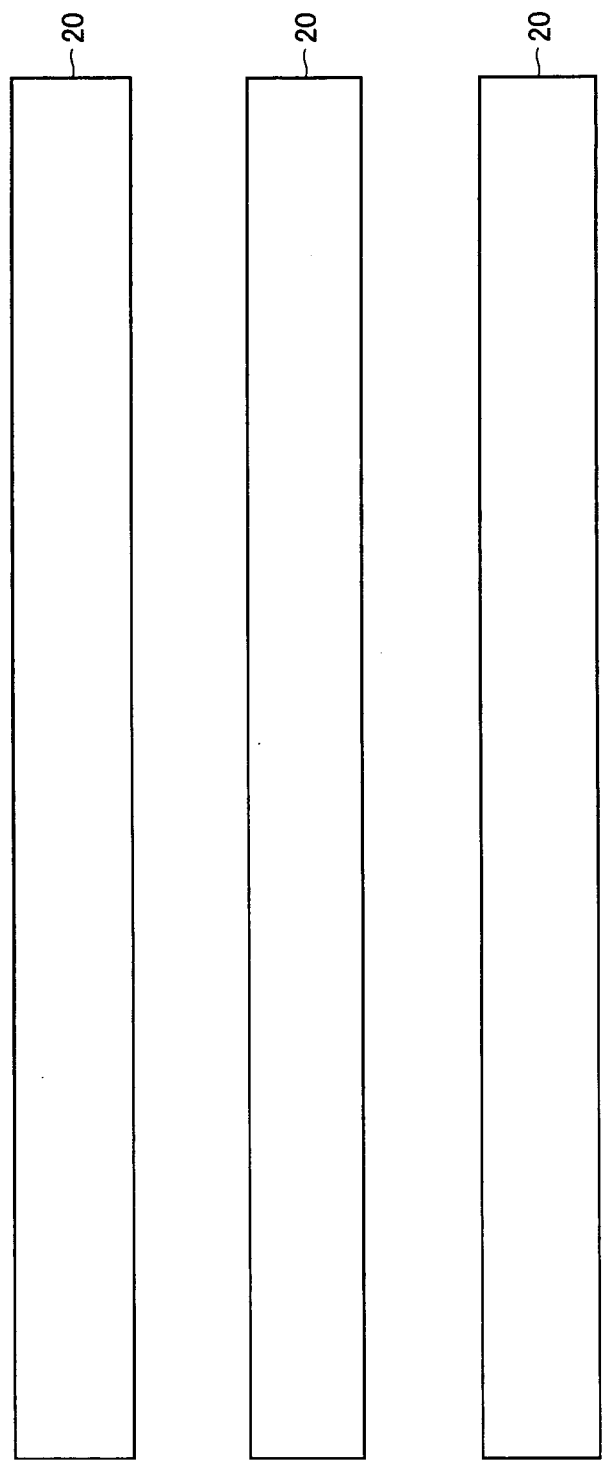
FIGS. 6 to 9 each schematically represent a manufacturing step of the magnetic semiconductor memory device according to the first embodiment of the present invention.

FIG. 6 schematically shows a manufacturing step of a memory cell array according to the first embodiment of the present invention. As shown in FIG. 6, first, on the surface of semiconductor substrate region, strip-like active regions 20 continuously extending in X direction are formed spaced away from one another along Y direction. Active regions 20 adjacent to each other along Y direction are isolated by an isolation region, not shown. It is only required to form active regions 20 in a strip-like manner, and it is not necessary to delineate an active region for each transistor. Thus, the manufacturing step is simplified and miniaturization of a transistor element is enabled. Additionally, the edge region of active region in a transistor element is eliminated, and thus variation in the shape of edge regions, or the edge effect is reduced.

Figure 7:
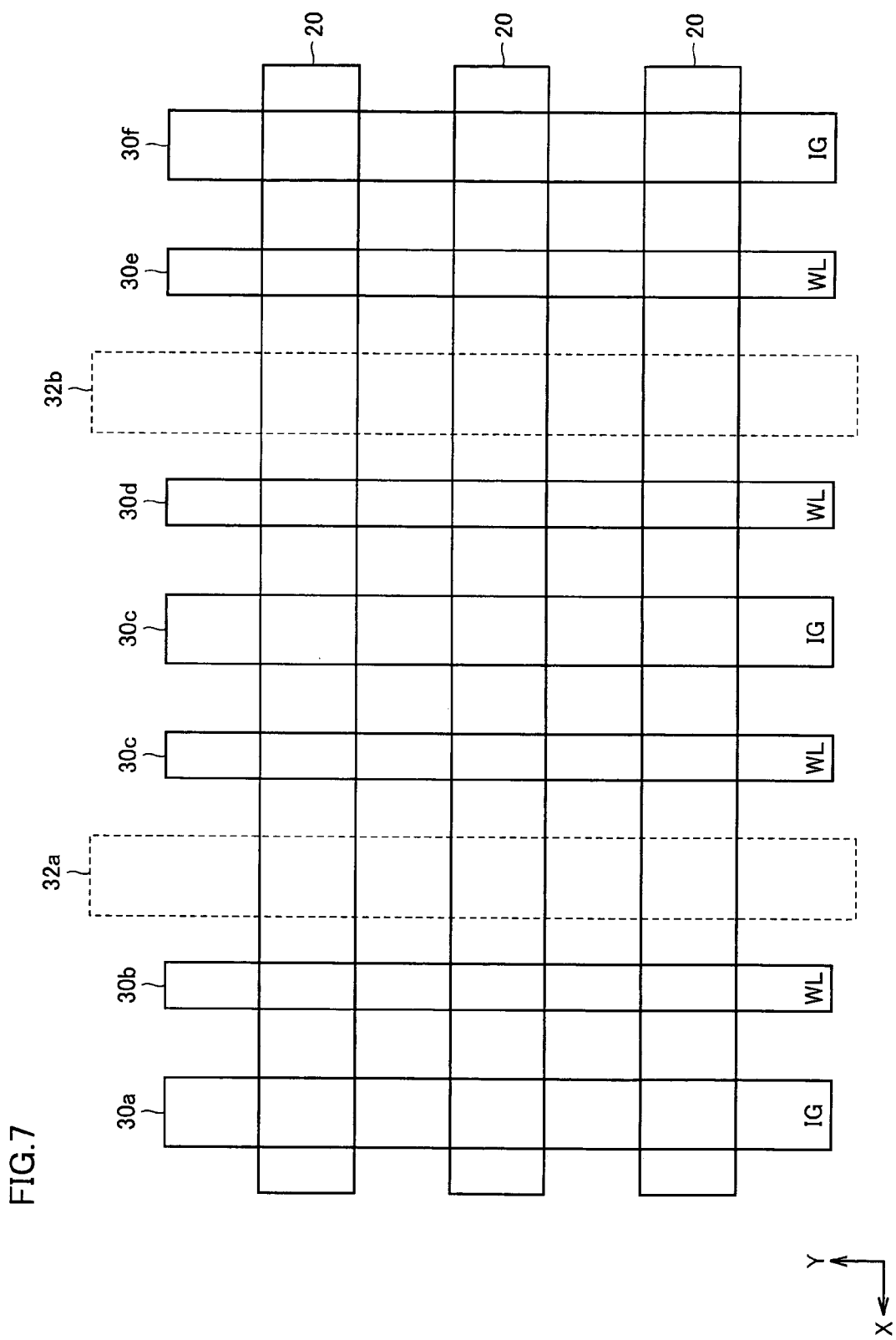

FIG. 7 schematically shows the layout in the next step of the manufacturing step of the memory cell array according to the first embodiment of the present invention. As shown in FIG. 7, conductive layers 30*a*-30*f* are formed at prescribed intervals in Y direction, so as to be perpendicular to active regions 20. Conductive layers 30*a*, 30*c* and 30*f* are used as isolation gate electrode layers, and each corresponds to conductive layer 25 shown in FIG. 5. Conductive layers 30*b*, 30*c*, 30*d* and 30*e* are used as word lines WL, and correspond to conductive layers 22*a*-22*d* shown in FIG. 5. Conductive layers 30*a*-30*f* are all formed at the common interconnection layer. When conductive layers 30*a*-30*f* forming word lines WL and isolation gate electrode layers IG are formed, N type impurities are implanted into active regions 30, using conductive layers 30*a*-30*f* as a mask.

In the N type impurity implantation step, to the region where P type impurity layer as a source line is to be formed, masks 32*a* and 32*b* may be formed so that masks 32*a* and 32*b* may also be used as masks for the N type impurity implantation in performing the N type impurity implantation to active regions 20. However, when the impurity concentration of the N type impurity region is not so high, and when a P type impurity layer having a sufficient P type impurity concentration is formed through a so-called counter dope of P type impurity forming the source line, these masks 32*a* and 32*b* may not necessarily be provided.

Figure 8:
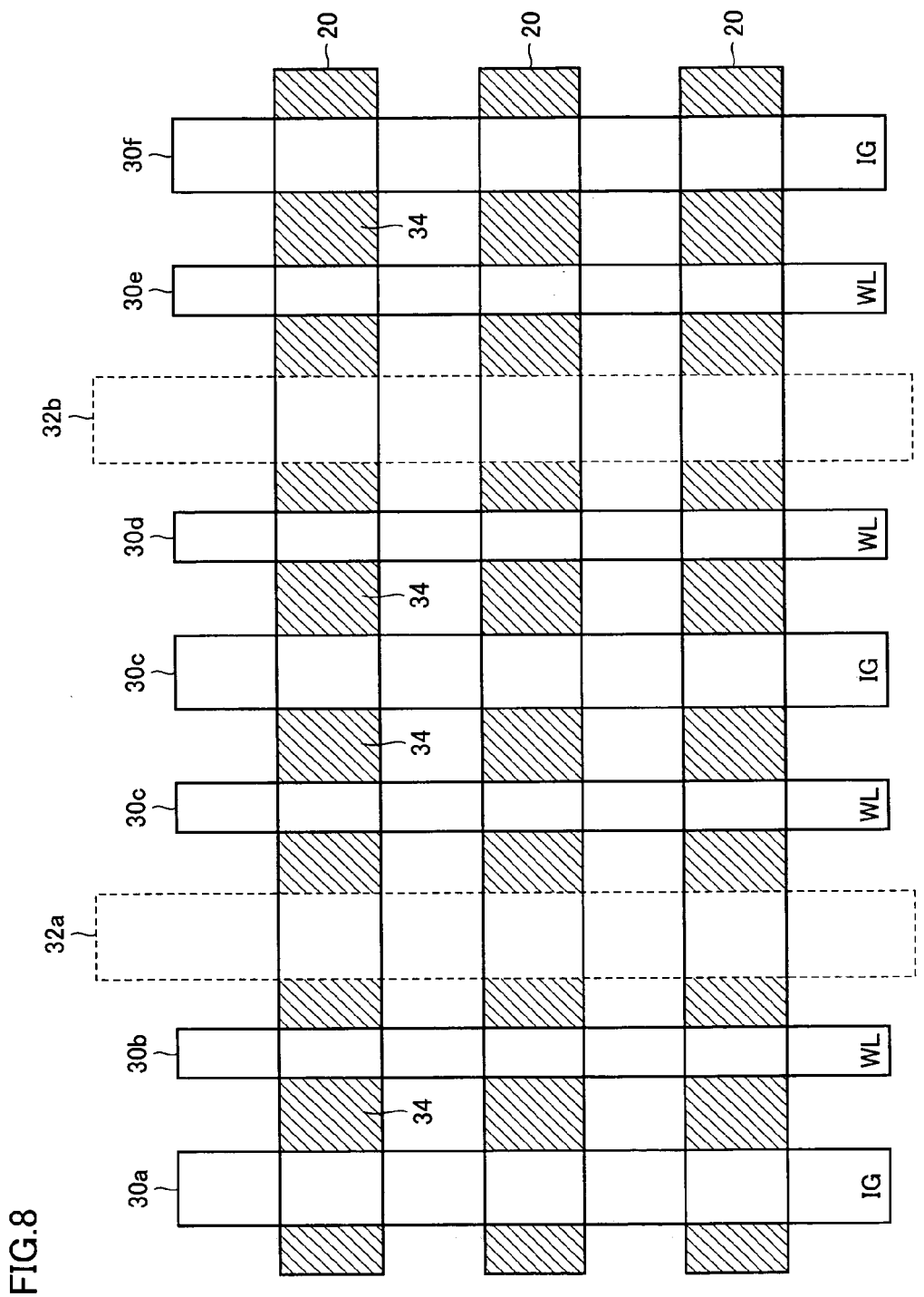

Then, as shown in FIG. 8, by implanting an N type impurity using conductive layers 30*a*-39*f* as a mask, N type impurity regions 34 are formed in a self-aligned manner in active regions 20.

Figure 9:
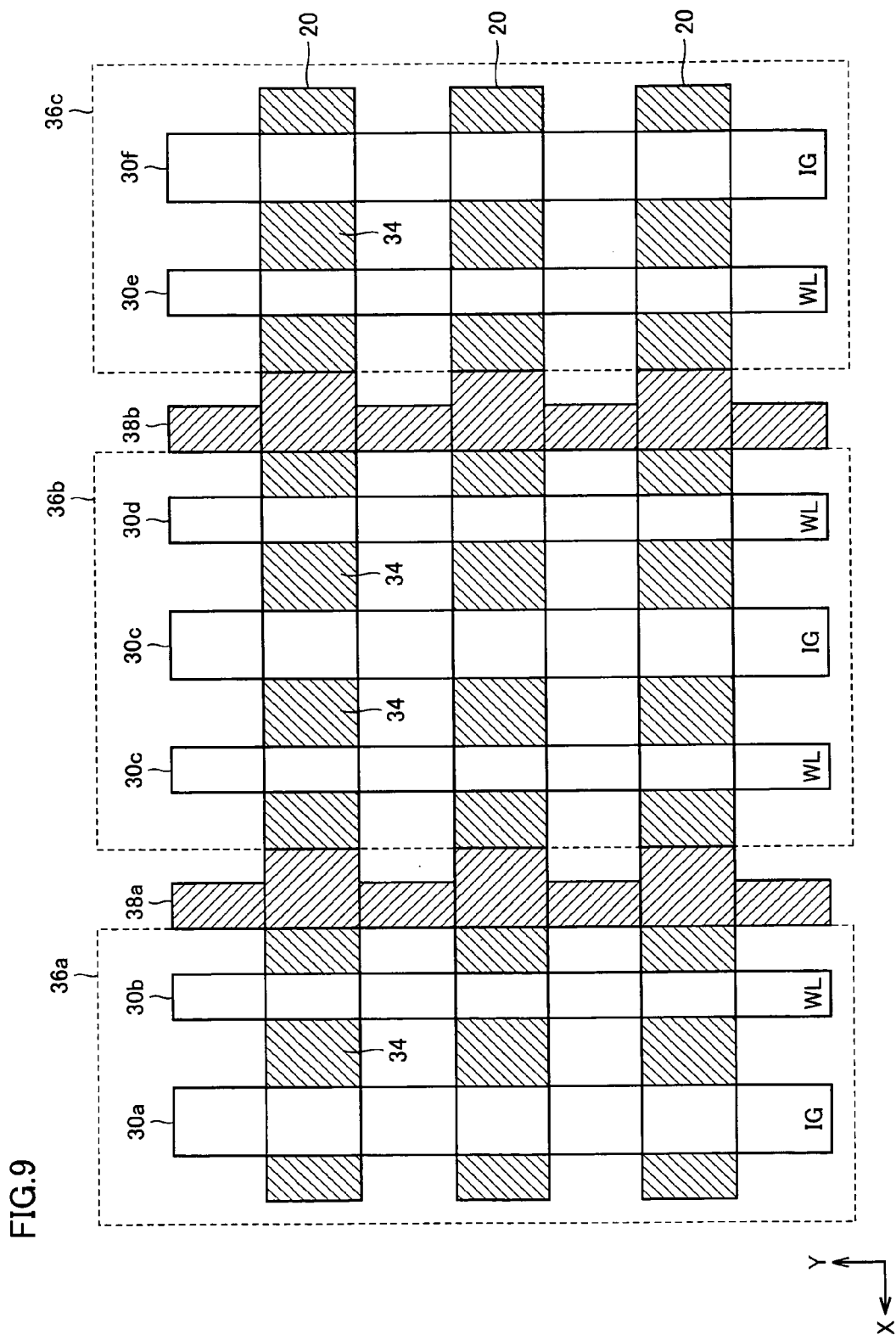

FIG. 9 schematically shows a manufacturing step of forming a P type impurity layer. As shown in FIG. 9, after N type impurity regions 34 are formed, masks 36*a*, 36*b* and 36*c* are formed on the N type regions except the regions where source lines are to be formed. Using masks 36*a*-36*c* as the mask, ion implantation of P type impurity is performed, to form P type impurity layers 38*a* and 38*b*. In FIG. 9, the line width of P type impurity layers 38*a* and 38*b* are made smaller than the width of the masks in the region between active regions 20 in Y direction. This is because the cell isolation regions formed between active regions 20 define the line width of P type impurity layers 38*a* and 38*b*. Specifically, in the cell isolation region, in order to form a P type impurity region, in the first element isolation region forming step, cell isolation films are not formed in the regions corresponding to the regions in which P type impurity layer 38*a* and 38*b* are to be formed, or in the cell isolation regions between active regions 20, cell isolation films are removed before formation of P type impurity regions and a step of exposing the substrate region is performed. Alternatively, after formation of active regions 20, P type impurity regions may be formed prior to formation of conductive layers of word lines, followed by implantation of N type impurity into active regions in a self-aligned manner.

In forming P type impurity layers 38*a* and 38*b*, it is merely required to form linear P type impurity layers 38*a* and 38*b* continuously extending in Y direction. Accurate alignment precision for P type impurity layers 38*a* and 38*b* is not required, and a certain degree of mask misalignment such as exposure displacement does not cause any problem. This is because impurity layers 38*a* and 38*b* are merely required to connect the source lines of memory cell transistors formed in active regions 20 to the substrate region, and thus geometrical feature precision is not so rigorously required.

After P type impurity layers 38a and 38b are formed and masks 36a-36c are removed, a mask, which is not shown, is formed to deposit metal material such as cobalt silicide (CoSi) or nickel silicide (NiSi) on the surface of active regions 20. By the formation of low resistance film (metal silicide film) of metal material on the surface of active regions 20, the problem of breakdown voltage of the PN junctions between P type impurity layers 38a and 38b and adjacent N type impurity regions 34 can be prevented, and memory cell currents can be transmitted via P type impurity layers 38a and 38b from N type impurity regions 34 of the respective memory cell transistors. Additionally, by forming the metal material films on active regions 20, variations in the resistance due to mask misalignment of N type impurity regions 34 can also be suppressed, and the element characteristics can be made uniform.

It is noted that, in FIG. 9, reference characters are also allotted to conductive layers 30a-30f serving as word lines WL or isolation gate electrode layers, for the purpose of correlation with the layout shown in FIG. 8. They have been formed in the step shown in FIG. 8, and description thereof referring to FIG. 9 is not made.

By forming P type impurity layers 38a and 38b linearly and continuously in Y direction, the area of source lines can be increased, the discharge of memory cell current to the substrate region can be dispersed, and a rise in the substrate potential can be prevented. Thus, the source potential can reliably be maintained at a prescribed level and a memory cell current according to the resistance value of the variable resistance element, that is, storage data of the memory cell can be generated at a selected memory cell.

As above, according to the first embodiment, in a magnetic semiconductor memory device using a TMR element as a storage element, a source line conducting a memory current in data reading is formed with an impurity layer having the same conductivity type as the substrate region and adjacent to each memory cell transistor, whereby a rise in potential of the source line in data reading can be suppressed, and a memory cell current according to the storage data of the memory cell can precisely be driven.

Second Embodiment

Figure 10:
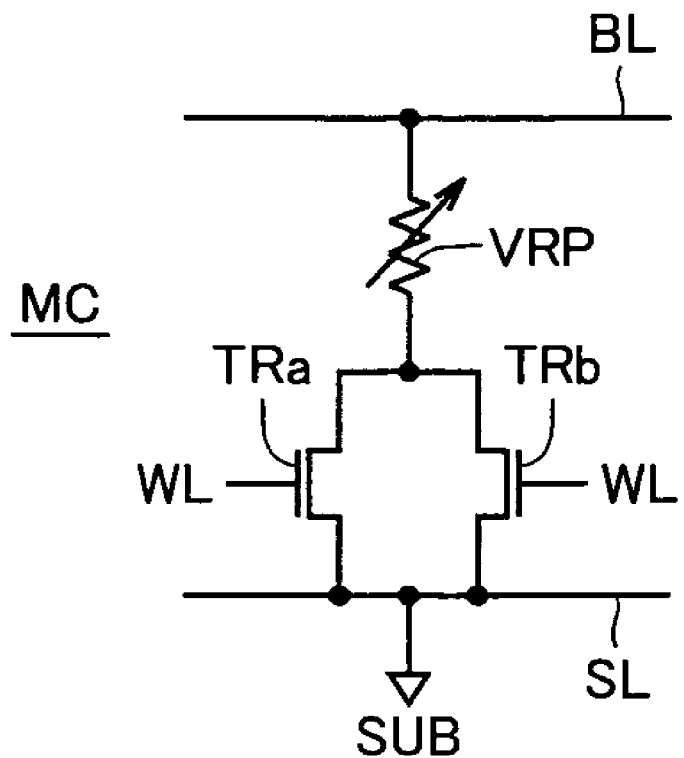
FIG. 10 schematically shows a configuration of a memory cell of a non-volatile semiconductor memory device according to a second embodiment of the present invention.

FIG. 10 schematically shows a configuration of a memory cell of a non-volatile semiconductor memory device according to a second embodiment of the present invention. In FIG. 10, a memory cell MC includes a variable resistance element VRP formed of a phase change element changing its crystal state in accordance with storage data, select transistors TRa and TRb connected in parallel between variable resistance element VRP and source line SL. To the gates of select transistors TRa and TRb, word lines WL are connected, and word lines WL are supplied with the same select signal. Similarly to the first embodiment, source line SL is electrically coupled to substrate region SUB through an impurity region.

Variable resistance element VRP is connected to bit line BL. Variable resistance element VRP is formed of, for example, a GST (Ge—Sb—Te) film, and its crystal state changes between a crystalline state and an amorphous state in accordance with storage data. In the crystalline state, the resistance value of variable resistance element VRP is small, while in the amorphous state, the resistance value of variable resistance element is large. Accordingly, similarly to a TMR element, storage data of memory cell MC can be detected by detecting the current amount flowing between bit line BL and source line SL.

In memory cell MC, by providing select transistors TRa and TRb in parallel, a heater current when causing a phase change in variable resistance element VRP can be increased. Additionally, the memory cell current can precisely be detected in data reading.

Figure 11:
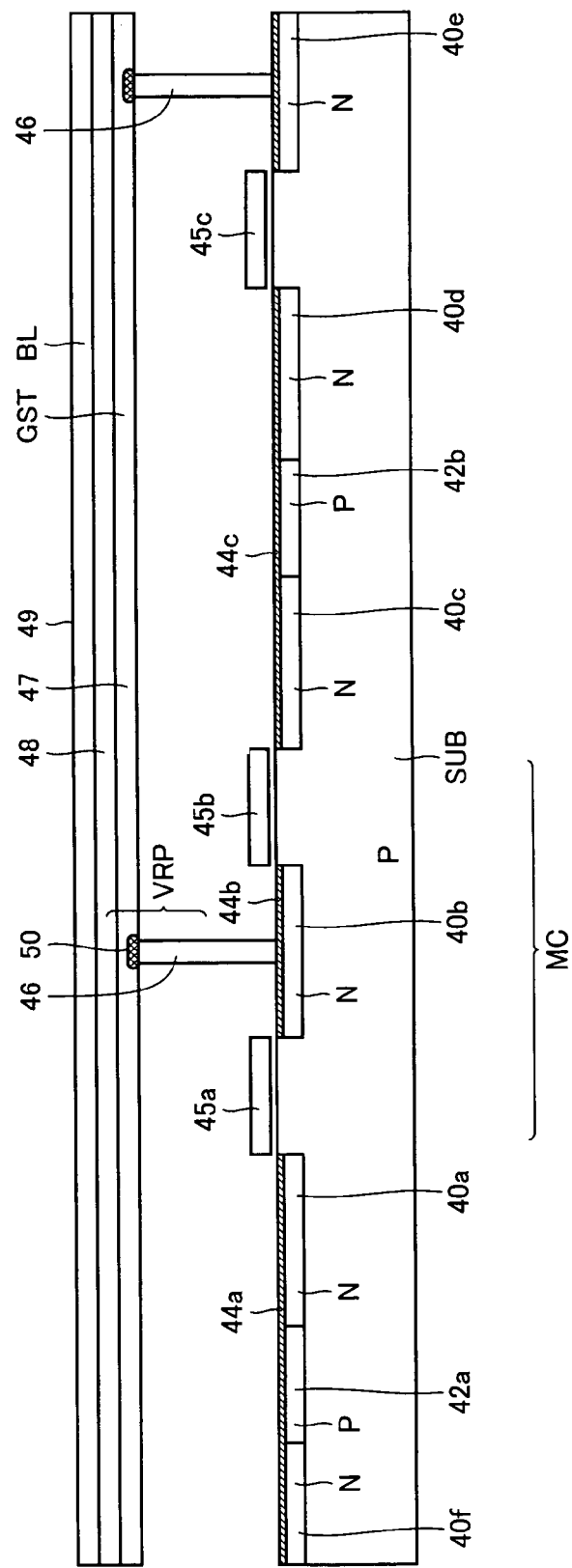
FIG. 11 schematically shows a cross-sectional structure of the memory cell shown in FIG. 10.

FIG. 11 schematically shows a cross-sectional structure of the memory cell of the non-volatile semiconductor memory device according to the second embodiment of the present invention. In FIG. 11, memory cell MC includes N type impurity regions 40a, 40b and 40c formed on the surface of P type semiconductor substrate region SUB, a gate electrode layer 45a formed above the substrate region between impurity regions 40a and 40b, a gate electrode layer 45b formed above the substrate region between N type impurity regions 40a and 40c, P type impurity regions 42a and 42b formed on P type substrate region SUB adjacent to impurity region 40a and 40c, respectively, and a heater layer 46 connected to N type impurity region 40b.

Heater layer 46 is connected to a GST (Ge—Sb—Te) film 47. GST film 47 is coupled to conductive layer 49 constituting bit line BL via an intermediate layer 48 formed of, for example, tungsten. Intermediate layer 48 constitutes an upper electrode of a phase change element, and connects GST film 47 to the upper conductive layer 49 constituting bit line BL.

Similarly, the adjacent memory cell also includes N type impurity regions 40d and 40e formed on the surface of P type substrate region SUB, and a gate electrode layer 45c formed above the substrate region between impurity regions 40d and 40e.

Impurity regions 40b and 40e are each connected to heater layer 46 through a metal film (metal silicide film) 44b such as a CoSi film. A metal film 44c is formed also on the surface of impurity regions 40c, 42b and 40d, and these impurity regions are electrically connected together. Similarly, a metal layer 44a is formed on the surface of impurity regions 40a, 42a and 44f, and these impurity regions are electrically connected together.

Variable resistance element VRP shown in FIG. 10 corresponds to the portion of intermediate layer 48, GST layer 47 and heater layer 46.

Gate electrode layers 45a and 45b each constitute a part of a word line, and receive a common word line select signal. In data writing, these word lines (gate electrode layers) 45a and 45b are brought into selected state, a large current is supplied from a source line to heater layer 46, and a portion 50 of GST film 47 close to heater layer 46 has the crystal state changed into an amorphous state by the heat generation of heater layer 46, and then is quenched to maintain the amorphous state. On the other hand, when the crystalline state is to be maintained, the portion of GST film is heated by the heater and then is gradually cooled, heated portion 50 of GST film 47 changes from the amorphous state to the crystalline state again.

GST film 47 only changes its crystal state in heated portion 50 near heater layer 46. The heat generating state of heater layer 46 does not disadvantageously affect adjacent memory cells. Thus, data can accurately be stored in each memory cell.

On opposing sides of impurity region 40b to which heater layer 46 is connected, gate electrode layer 45a and 45b constituting word lines are arranged to equivalently broaden the channel width of word line select transistor, thereby increasing the driving current in data writing. In this data writing, a current is supplied from substrate region SUB to heater layer 46 of a selected cell. Accordingly, substrate region SUB is required to maintain the PN junction between the impurity region connected to heater layer 46, such as N type impurity regions 40 and 40*e*, in a non-conductive state. Therefore, in data writing, bit line BL is set to a negative voltage level, substrate region SUB is maintained at the ground voltage level, and the PN junction of substrate region SUB is maintained in a non-conductive state. Only in a selected cell, a write current is supplied from P type impurity region 42*a* or 42*b* through a memory cell select transistor (MT) to heater layer 46. Thus, the potential of P type substrate region SUB is prevented from being higher than N type impurity region, so that a write current is prevented from being supplied to heater layer 46 in a non-selected memory cell.

Figure 12:
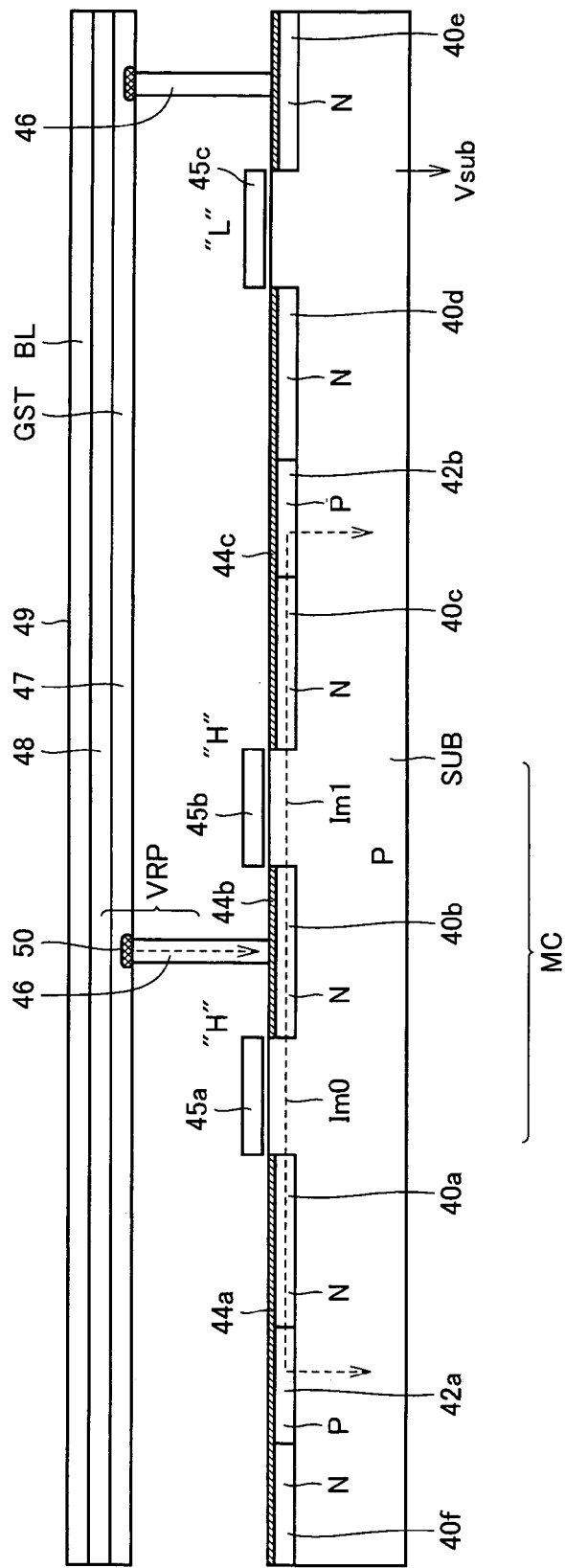
FIG. 12 schematically shows a path of a read current flowing in the memory cell structure shown in FIG. 11.

FIG. 12 schematically shows a path of a read current flowing in memory cell MC shown in FIG. 11. As shown in FIG. 12, when reading storage data of memory cell MC, a read current is supplied from bit line BL. In this case, gate electrode layers 45*a* and 45*b* constituting word lines WL are driven to selected state of H level (logical high level), while adjacent memory cells are in non-selected state and gate electrode layer 45*c* is maintained at L level (logical low level). In this state, in accordance with the resistance value of phase change region 50 of variable resistance element VRP of memory cell MC, a memory cell current flows from heater layer 46 to N type impurity region 40*b*. The memory cell current branches into N type impurity regions 40*a* and 40*c* through the channel layers formed under gate electrode layers 45*a* and 45*b*, respectively, and memory cell currents Im0 and Im1 flow. Currents Im0 and Im1 flow into adjacent P type impurity regions 42*a* and 42*b* by metal layers 44*a* and 44*c*, and further flow into P type substrate region SUB. On the surfaces of impurity regions 40*a* and 40*c*, low resistance metal layers 44*a* and 44*c* are formed. Therefore, even when diffusion resistance of impurity regions 40*a* and 40*c* are high, memory cell currents Im0 and Im1 is discharged with low resistance, and a rise in potential of the source line can be suppressed. Additionally, even when the PN junction between impurity regions 40*a* and 42*a* is in a non-conductive state, it is possible to cause the memory cell current Im0 to flow into P type impurity region 42*a* via metal layer 44*a* of low resistance. Similarly, in impurity regions 40*c* and 42*b* also, it is possible to cause a current to flow into substrate region SUB via metal layer 44*c* of low resistance, and the problem of shutting off a current by a PN junction can be avoided.

The two-dimensional layout of N type impurity regions 40*a*-40*f* and P type impurity regions 42*a* and 42*b* constituting source lines in the second embodiment is the same as that in the first embodiment. The active regions are formed extending in X direction in a strip-like manner, and P type impurity layers forming P type impurity regions 42*a* and 42*b* forming source lines are formed extending linearly and continuously in Y direction in a direction perpendicular to the active regions.

Figure 13:
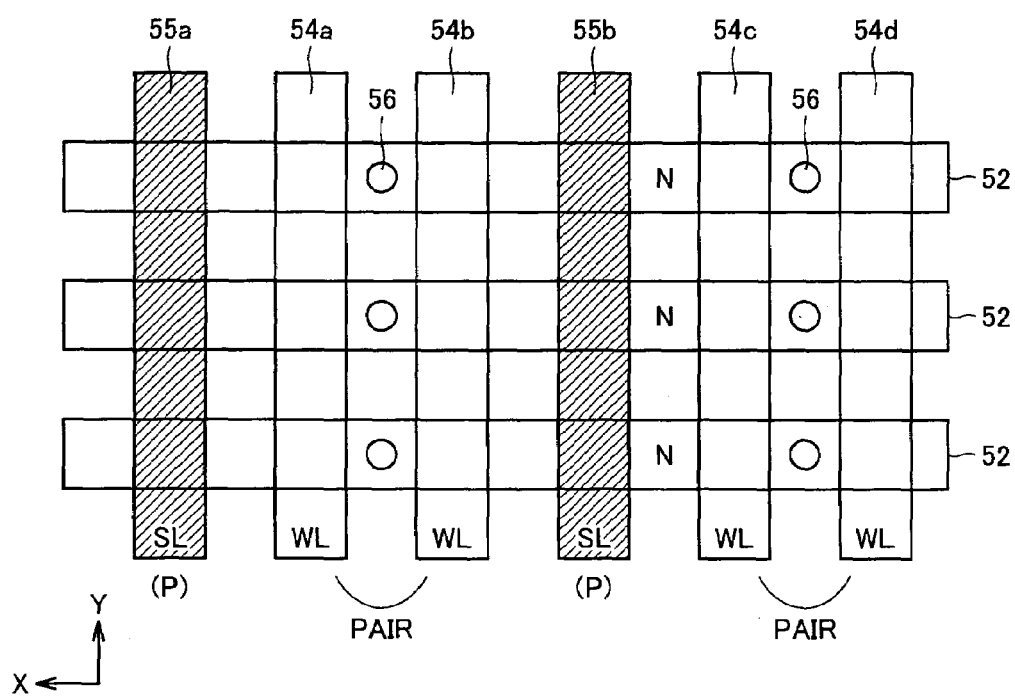
FIG. 13 schematically shows a layout of a memory cell array according to a modification of the second embodiment of the present invention.

FIG. 13 schematically shows a layout of an array of memory cells according to the second embodiment of the present invention. In FIG. 13, active regions 52 are formed continuously extending in X direction in a strip-like manner. Active regions 52 are the regions for forming transistors, and are the same as active regions 20 in the first embodiment. Gate electrode layers 54*a*-54*d*, each constituting word line WL, are formed continuously extending in Y direction so as to be perpendicular to active regions 52. In each active region 52 between adjacent word lines, a contact 56 for connecting to a heater layer is formed. Between the word lines of adjacent memory cells, P type impurity layers 55*a* and 55*b* forming source lines SL are formed in a direction perpendicular to active regions 52. Accordingly, in the layout shown in FIG. 13 also, the source lines are provided by the substrate region, the potential distribution of the source lines can be suppressed, and reading of memory cell current can be performed while maintaining the source lines at a prescribed potential. As the source lines are formed in a mesh-like shape equivalently and the source lines of the memory cells are connected together, the source line potential can be maintained stably.

In the layout shown in FIG. 13 also, the manufacturing steps described above referring to FIGS. 6-9 in the first embodiment can be employed as the manufacturing steps of forming active regions 52, P type impurity layers 55*a* and 55*b* and gate electrode layers 54*a*-54*d*.

As above, according to the second embodiment of the present invention, in a non-volatile semiconductor memory device in which phase change element is used as a storage element, a source line is formed with an impurity layer having the same conductivity type as a substrate region. Thus, a rise in source potential of a memory cell transistor in data reading can be suppressed, a memory cell current can be conducted in an amount corresponding to the storage data of the memory cell precisely, and correct data reading can be achieved.

Third Embodiment

Figure 14:
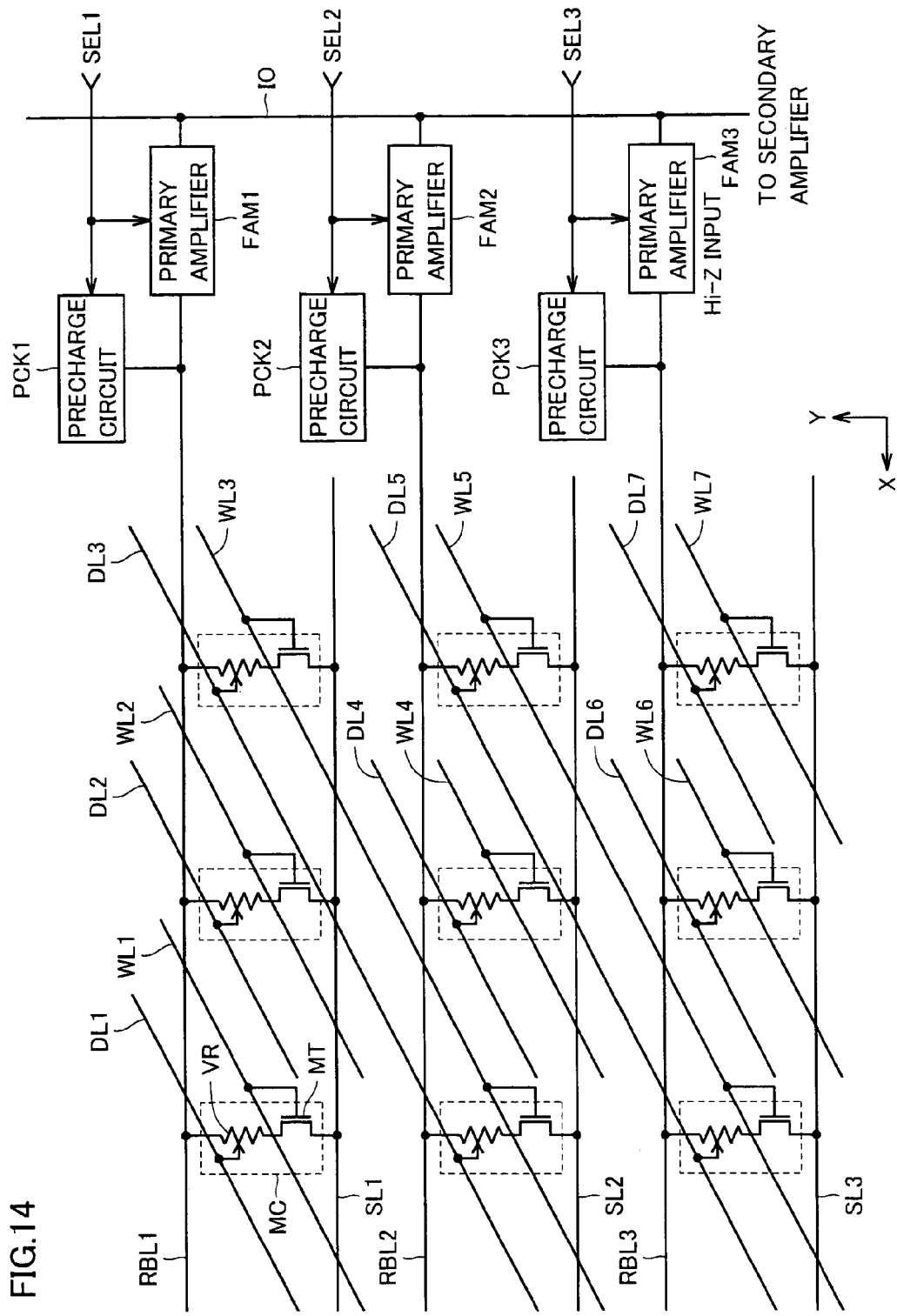
FIG. 14 schematically shows a configuration of a main part of a non-volatile semiconductor memory device according to a third embodiment of the present invention.

FIG. 14 schematically shows a configuration of a main portion of a non-volatile semiconductor memory device according to a third embodiment of the present invention. In FIG. 14, memory cells MC equivalently arranged in three rows and three columns are representatively shown. In the arrangement of memory cells MC shown in FIG. 14, to memory cells MC aligned in column direction (X direction), a read bit line and a source line SL are arranged in pair. Specifically, a pair of read bit line RBL1 and source line SL1 are arranged extending along X direction, and a pair of read bit line RBL2 and source line SL2 are arranged extending in X direction. Similarly, read bit lines RBL3 and source lines SL3 are arranged extending along X direction.

In the array of memory cells MC, the memory cells aligned in Y direction are coupled to different word and digit lines. In FIG. 14, word lines WL1-WL7 and digit lines DL1-DL7 are shown.

Memory cell MC includes a variable resistance element VR formed of a TMR element, and a select transistor MT formed of an N channel MOS transistor that is selectively made conductive in accordance with a signal potential on corresponding word line WL (WL1-WL7) and that connects corresponding variable resistance element VR to corresponding source line SL (SL1-SL3) when made conductive.

Source of select transistor MT is electrically connected to the substrate region via an impurity region having the same conductivity type as the substrate region, as in the first embodiment. However, in the third embodiment, in place of the configuration where a source line is made common to all of the memory cells, a configuration where each source line is individually connected to a ground potential in data reading may be employed.

Read bit lines RBL1-RBL3 are provided separately from write bit lines (not shown in FIG. 14), similarly to the configuration described in the first embodiment. Read bit lines RBL1-RBL3 are provided respectively with precharge circuits PCK1-PCK3 and primary amplifiers FAM1-FAM3.

Precharge circuits PCK1-PCK3 are selectively activated in response to select signals SEL1-SEL3 to supply a prescribed precharge voltage to corresponding read bit lines RBL when activated. Select signals SEL1-SEL3 are activated when corresponding read bit lines are in a selected state.

Primary amplifiers FAM1-FAM3 are activated when corresponding select signals SEL (SEL1-SEL3) are activated to amplify a signal potential according to the current on corresponding read bit lines RBL (RBL1-RBL3) and transmitting an amplified signal to an internal data line IO. Primary amplifiers FAM1-FAM3 are each of high input impedance, and in an amplifying operation, they perform, when selected, data reading without affecting the potential of corresponding read bit lines RBL, to transmit to internal data line IO a voltage signal corresponding to the read potential. Internal data line IO is coupled to a read circuit such as a secondary amplifier.

Read bit line RBL and a write bit line are separately provided, and a bit line write driver that drives a bit line write current in data writing is not connected to the read bit line. To the read bit line, only a precharge circuit and a primary amplifier of high input impedance are connected. Accordingly, the load of read bit line RBL is alleviated, read bit line RBL can be driven at fast speed in accordance with a memory cell current, and read bit line potential can be changed at high speed in accordance with storage data of a memory cell. Thus, read data can be transmitted at high speed to internal data line IO.

Precharge circuits PCK1-PCK3 may be of the type that precharges and maintains a corresponding read bit line to an intermediate potential at the initial stage of starting an access, or they may have a configuration that drives to a precharge potential at the level of a preset voltage, such as a power supply voltage VCC, or ground voltage, or a reference potential different from power supply VCC and ground voltage GND after a data read access is started.

If primary amplifiers FAM1-FAM3 each have a configuration of a gate-input type amplifier circuit having a gate connected to a corresponding read bit line, as corresponding read bit lines RBL1-RBL3 are isolated from the internal data line, the output load can be alleviated. Additionally, as internal data line IO is driven by primary sense amplifiers FAM, a memory cell current is not required to drive the internal data line, and only required to drive the read bit line. Accordingly, the capacitance driven by a memory cell current can be reduced, and fast data reading can be achieved.

Figure 15:
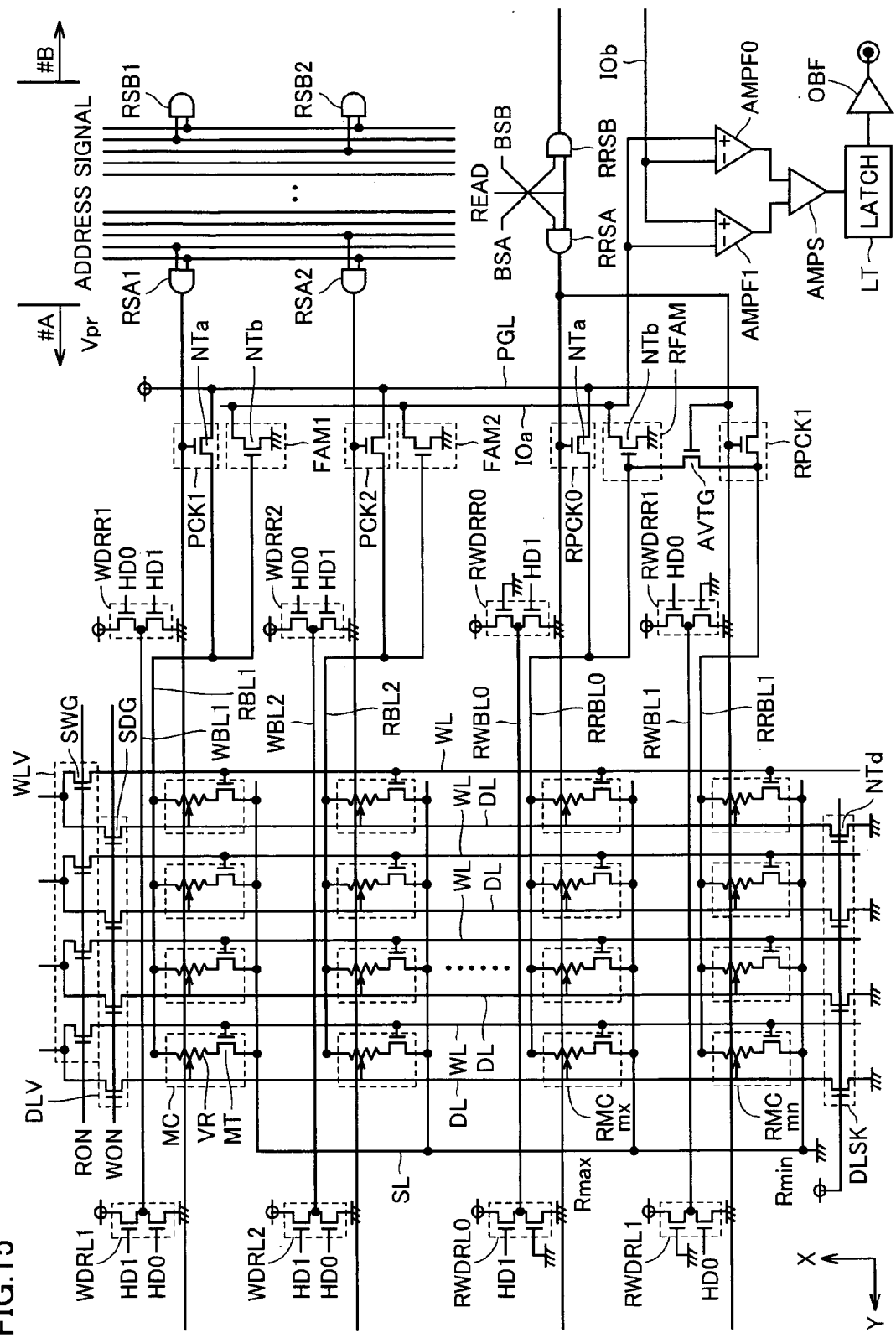
FIG. 15 shows specifically the configuration of the main part of the non-volatile semiconductor memory device according to the third embodiment of the present invention.

FIG. 15 schematically shows a configuration of a main portion of the non-volatile semiconductor memory device according to the third embodiment of the present invention. In FIG. 15, (normal) memory cells MC are arranged in rows and columns. Memory cell MC includes a TMR element as a storage element, and includes select transistor MT and variable resistance element VR (TMR element). Dummy cells RMC are arranged aligned with memory cells MC in X direction. Dummy cell RMC has the same configuration as memory cell MC, and includes a reference cell RMCmx in which the resistance value of the variable resistance element is the maximum value Rmax, and a reference cell RMCmn in which the resistance value of the variable resistance element is resistance value Rmin. Reference cells RMCmx are arranged aligned along Y direction, and reference cells RMCmn are arranged aligned along Y direction. While resistance values Rmax and Rmin are the values corresponding to data "1" and "0", respectively, this correspondence of resistance values Rmax and Rmin and the logic values of data may be conversed.

In the following description, Y direction is referred to as column direction, while X direction is referred to as row direction. Accordingly, a memory cell column refers to memory cells aligned in Y direction, while a memory cell row refers to memory cells aligned in X direction.

To each column of memory cells MC, write bit line WBL and read bit line RBL are arranged in parallel. In FIG. 15, write bit lines WBL1 and WBL2 and read bit lines RBL1 and RBL2 are representatively shown. On opposing ends of write bit line WBL (WBL1, WBL2), bit line write drivers WDRL (WDRL1, WDRL2) and WDRR (WDRR1, WDRR2) are provided. Left side bit line write drivers WDRL1 and WDRL2 supply a current to corresponding write bit lines WBL in accordance with 1 write control signal HD1 when writing data "1". When writing data "0", left side bit line write drivers WDRL1, WDRL2 discharge a current from corresponding write bit lines WBL (WBL1, WBL2) to a ground node (reference potential node) in accordance with 0 write control signal HD0. Write control signals HD1 and HD0 are generated based on write data and a column address signal in data writing.

Right side bit line write driver WDRR (WDRR1, WDRR2) supplies a current to corresponding write bit line WBL (WBL1, WBL2) in accordance with 0 write control signal HD0, and when writing data "1", discharges a current from corresponding write bit line WBL (WBL1, WBL2) in accordance with 1 write control signal HD1.

By providing bit line write drivers WDRL and WDRR on the opposing ends of write bit, line WBL, and by switching the charging/discharging path in accordance with write data, the direction of a current flowing through write bit line WBL can be set in accordance with write data. Hence, the direction of its induced magnetic field can be set, and the magnetization direction of the free layer of the TMR element that is the variable magneto-resistance element can be set in accordance with write data.

Similarly, to a column of reference cells RMCmx, reference write bit line RWBL0 and reference read bit line RRBL0 are provided, and to a column of reference cell RMCmn, reference write bit line RWBL1 and reference read bit line RRBL1 are provided.

As storage data of reference cells RMCmx and RMCmn are fixed values, write drivers RWDRL0 and RWDRR0 each provided for reference write bit line RWBL0 are set respectively in a charging state and in a discharging state (in data writing). Accordingly, in reference write bit line RWBL0, in data reading, a current flows from reference write driver RWDR0 to reference bit line write driver RWDRR0 in FIG. 15.

As to reference write bit line RWBL1, write reference bit line write driver RWDRL1 discharges a current, and reference write bit line driver RWDRR1 supplies a current in accordance with 1 write control signal HD1. Accordingly, on reference write bit line RWBL1, in data writing, a current flows from reference bit line write driver RWDRR1 to reference bit line write driver RWDRL1.

To each row of memory cells MC and reference memory cells RMCmx and RMCmn, word line WL and digit line DL are provided. Digit line DL has one end connected to a ground node via a digit line discharge drive circuit DLSK. The digit line discharge drive circuit DLSK includes a discharging MOS transistor NTd provided for each digit line DL. The gate of MOS transistor NTd is fixed to a prescribed voltage level and drives a digit line current of a constant magnitude.

At the other end of each digit line DL, a digit line drive circuit DLV that supplies a current to the digit line in accordance with write select signal WON is provided, and in parallel thereto, a word line drive circuit WLV that supplies a drive voltage to selected word line WL in accordance with read select signal RON is provided for word line WL. In the third embodiment, drive circuits DLV and WLV are coupled together to a power supply circuit, which is not shown, and supply a drive current to a digit line or a word line of a selected row.

Read select signal RON and write select signal WON are multi-bit signals. Select transistor SDG provided for each digit line in digit line drive circuit DLV and drive transistor SWG provided for each word line in word line drive circuit WLV are each driven alternatively to a selected state.

Memory cell MC and reference cells RMCmx and RMCmn are commonly connected to a source line SL. This configuration for common connection to source line SL is implemented using the source line structure (an impurity layer having the same conductivity type as the substrate region) described in the first embodiment.

For each read bit line RBL, as shown in FIG. 14, precharge circuit PCK and primary amplifier FAM are provided. In FIG. 15, for read bit lines RBL1 and RBL2, precharge circuits PCK1 and PCK2 are provided, respectively, and primary amplifiers FAM1 and FAM2 are provided, respectively. Precharge circuits PCK1 and PCK2 are each formed of N channel MOS transistor NTa transmitting precharge voltage Vpr when made conductive. Primary amplifiers FAM1 and FAM2 are each formed of N channel MOS transistor NTb having its gate connected to a corresponding read bit line RBL (RBL1, RBL2).

For precharge circuits PCK1 and PCK2, read selectors RSA0 and RSA1 decoding an address signal are provided, respectively. Opposing to read selectors RSA0 and RSA1, read selectors RSB0 and RSB2 performing a precharge operation of read bit line in another memory block #B are provided. In this array configuration, both memory blocks #A and #B are selected. Memory cell MC is selected in one memory block, while dummy cells RMC (reference cells RMCmx, RMCmn) are selected in the other memory block, to generate a reference potential for the memory cell data in reading. Thus, a complementary data line configuration is implemented equivalently.

As shown in FIG. 15, read bit line RBL (RBL1, RBL2) is connected to the gate of N channel MOS transistor NTb of corresponding primary amplifier FAM (FAM1, FAM2). Accordingly, read bit line RBL is not required to drive internal data line IOa directly, and internal data line IOa can be driven at high speed in accordance with a current flowing through a selected memory cell.

To reference cells also, similarly, reference read bit lines RRBL0 and RRBL1 are provided corresponding to the column of reference cells RMCmx and the column of reference memory cells RMCmn, respectively. To reference read bit lines RRBL0 and RRBL1, precharge voltage Vpr is supplied by reference bit line precharge circuits RPCK0 and RPCK1, respectively. Reference bit line precharge circuits RPCK0 and RPCK1 are each driven to a selected state in accordance with an output signal of block selector RRSA. The output of block selector RRSA is set to an active state when both read instruct signal READ and block select signal BSB selecting memory block #B are in active state, to perform precharging of reference bit lines RRBL0 and RRBL1.

When memory block #A is selected, block select signal BSA is activated and the output signal of block selector RRSA attains a deactivated state, while the output signal of block selector RRSB is activated. In this state, the logic level of internal read data corresponding to data of the memory cell selected in memory block #A is determined, employing averaged value of currents corresponding to storage data of reference cells RMCmx and RMCmn of memory block #B as the reference potential.

Similarly, for reference bit lines RRBL0 and RRBL1 also, reference bit line amplifier RFAM is provided. Reference bit lines RRBL0 and RRBL1 are short-circuited in accordance with an averaging transistor AVTG that is made conductive in accordance with the output signal of block selector RRSA. Accordingly, one amplifier circuit RFAM is provided commonly to reference bit lines RRBL0 and RRBL1.

As to reference read bit lines also, precharge circuits RPCK0 and RPCK1 are each formed of N channel MOS transistor NTa. Amplifier circuit RFAM is also formed of N channel MOS transistor NTb having its gate coupled to reference bit lines RRBL0 and RRBL1. By providing averaging transistor AVTG in reference bit lines RRBL0 and RRBL1, currents Imax and Imin flowing through the memory cells having resistance values Rmax and Rmin are averaged, to generate a reference voltage corresponding to an average value of memory cell currents in reading H data and L data.

In order to perform reading of final data, there are provided first stage amplifiers AMPF0 and AMPF1 receiving a signal on internal data line IOa at positive input and negative input, respectively, a final stage differential amplifier AMPS for further differentially amplifying the output signals of first stage amplifiers AMPF0 and AMPF1, a latch circuit LT for latching the output signal of final stage differential amplifier AMPS, and an output buffer OBF for generating final output data in accordance with the latch data of latch circuit LT to output externally.

First stage amplifiers AMPF0 and AMPF1 are coupled to internal data line IOb of memory block #B at the negative input and positive input, respectively. Accordingly, when memory block #A is selected, data according to a current flowing through a selected memory cell is read to internal data line IOa and internal data line IOb is driven in accordance with reference data generated by reference cells in memory block #B. Reading of internal data is performed based on a comparison result of these data.

The output signals of first stage amplifiers AMPF0 and AMPF1 are complementary signals. In this case, the logic level of the output signals of first stage amplifiers AMPF0 and AMPF1 are inverted between the cases where a memory cell is selected in memory block #A and where a memory cell is selected in memory block #B. However, by inverting the logic level of internal data in accordance with a memory block select signal or by selectively inverting the logic level of write data in data writing to a memory block, the correspondence between the logic level of write data and that of read data can be maintained for each memory block.

In the configuration shown in FIG. 15, only to a selected column (memory cells aligned in Y direction), precharge voltage Vpr is supplied in accordance with an output signal of a read selector, to precharge selected read bit line RBL to a voltage level of voltage VCC-Vth (when precharge voltage Vpr is at the voltage VCC-Vth at minimum and when the output signal of selected read selector is at VCC level).

Accordingly, only to the selected read bit line, a precharge current is supplied and a memory cell current flows, and each non-selected read bit line is maintained in non-selected state. Accordingly, as precharge current is supplied to a selected read bit line only for a necessary period, current consumption can be reduced.

Additionally, as reading of complementary internal data is performed equivalently using memory blocks #A and #B, when the block size of memory blocks #A and #B is small, the effect of noise will be in a common phase, and data reading can be performed while canceling the effect of noise. Accordingly, data reading with large noise margin can be achieved.

Figure 16:
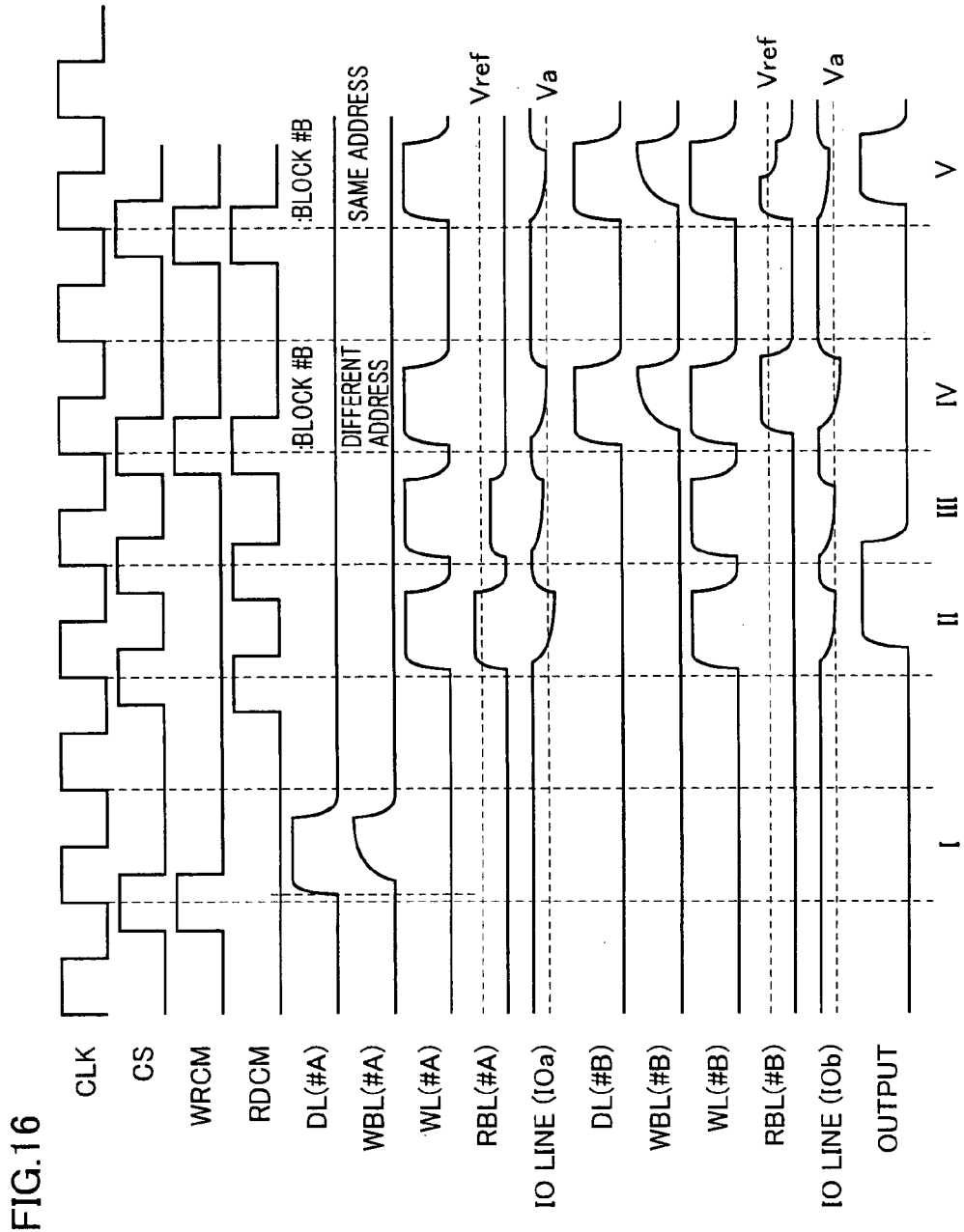
FIG. 16 is a timing diagram representing an operation of the circuit shown in FIG. 15.

FIG. 16 is a timing diagram representing an operation of the non-volatile semiconductor memory device shown in FIG. 15. In the following, data writing/reading operation of the non-volatile semiconductor memory device shown in FIG. 15 is described with reference to FIG. 16.

In the non-volatile semiconductor memory device, an operation cycle is determined by an externally applied clock signal CLK, and one operation cycle starts at a rising edge of clock signal CLK. Specifically, by an externally supplied command at a rising edge of clock signal CLK, an operation mode in that cycle is set. When a chip select signal CS is at H level of an active state, if one of write command (or write instruct signal) WRCM and read command (or read instruct signal) RDCM is in an active state, data writing or data reading is instructed. A "command" is expressed by a combination of logic levels of a plurality of signals CS, WRCM and RDCM. However, these signals CS, WRCM and RDCM may be decoded operation mode instruct signals.

In cycle I, data writing is instructed, and a memory cell is selected in memory block #A, and digit line DL and write bit line WBL corresponding to the selected memory cell are driven in accordance with write data. In this write operation, first, as to digit line DL, drive gate transistor SDG corresponding to the selected digit line turns on in accordance with write select signal WON, and the selected digit line is supplied with a current and its potential rises. In data writing, non-selected memory block #B maintains the non-selected state.

After the digit line current is stabilized, for selected write bit line WBL, corresponding bit line write drivers WDRL and WDRR are selected and activated in accordance with write data and a column select signal, and the selected write bit line is supplied with a current. In this write bit line current driving, by adjusting the transistor size of the write driver, the write current is prevented from abruptly flowing into the write bit line, and the bit line write current can moderately be changed to adjust its induced magnetic field. By the induced magnetic field of write bit line WBL and digit line DL, the magnetization direction of corresponding magneto-resistance element of the selected memory cell is set. Thus, in memory block #A, data writing to the selected memory cell is completed.

In cycle II, in accordance with read command RDCM and a block address not shown, data reading is designated to memory block #A. When read command RDCM is supplied, in memory block #A, word line driver WLV supplies a current to a selected word line in accordance with read select signal RON, to drive a selected word line WL to selected state. In response, in a memory cell connected to the selected word line, select transistor MT turns on, and corresponding variable magneto-resistance element VR (TMR element) is coupled to source line SL.

Here, again, a precharge circuit corresponding to a read bit line of the selected column is activated by read selector RSA, and precharge voltage Vpr is supplied to read bit line RBL and its voltage level rises. In FIG. 16, the resistance value of a variable magneto-resistance element of the selected memory cell is Rmax, and a memory cell current is small. Therefore, the voltage level of selected read bit line RBL is driven to a voltage level higher than reference voltage Vref In accordance with the voltage level rising of read bit line RBL, the gate potential of N channel MOS transistor NTb of corresponding primary amplifier FAM rises, and the potential level of internal data line IOa lowers from precharge voltage level (to be lower than reference voltage Va).

In memory block #B, similarly an operation of selecting a word line WL is performed, and reference cells RMCmx and RMCmn are simultaneously selected in parallel to memory cell data reading in memory block #A. The currents flowing through these reference cells are averaged by averaging transistor AVTG in memory block #B, and voltage level of corresponding internal data line IOb attains the voltage level of reference voltage Va. The voltages of internal data lines IOa and IOb are compared and amplified by first stage amplifiers AMPF0 and AMPF1, and further amplified by final stage differential amplifier AMPS. Thus, H level data is latched by latch LT, and then external data corresponding to the latch data is output through output buffer OBF at a prescribed timing.

When cycle II is completed, memory block #A is once driven to non-selected state, read bit line RBL is again initialized to the ground voltage level, and internal data line IOa is driven to a prescribed precharge voltage level. This initialization operation is similarly performed in memory block #B.

In a cycle III, when a read instruction to memory block #A is provided again in accordance with the activation of read command RDCM, data reading as in the cycle II is performed in memory block #A. Precharge voltage Vpr is supplied to a selected read bit line by precharge circuit PCK corresponding to the selected read bit line. When the resistance value of the variable magneto-resistance element of a selected memory cell is Rmin, a current of the memory cell is large, and the voltage level of selected read bit line RBL attains a voltage level lower than reference voltage Vref. Accordingly, as the gate potential of N channel MOS transistor NTb of corresponding primary amplifier is low and the conductance thereof is small, internal data line IOa has a small potential level drop, and is maintained at the voltage level higher than reference voltage Va. In memory block #B, reference cells RMCmx and RMCmn are selected, and the voltage level of internal data line IOb attains the level of reference voltage Va. Amplifying operations by amplifier circuits AMPF0, AMPF1 and AMPS are performed, and L level data is output.

In a cycle IV, data writing and reading are specified in parallel to memory block #B. In this case, when a selected address is different in data writing and in data reading in memory block #B, as write bit line WBL and read bit line RBL are different, a write current is supplied to each of digit line DL and write bit line WBL, while data reading is performed to word line WL and read bit line RBL in memory block #B. In data reading, as the resistance value of the selected memory cell is high and a memory cell current is small, the voltage level of read bit line RBL attains the voltage level higher than reference voltage Vref, and accordingly, the voltage level of internal data line IOb attains the voltage level lower than reference voltage level Va.

In this case, in memory block #A also, word line WL is selected, internal data line IOa attains reference voltage Va level by reference cells RMCmx and RMCmn. Accordingly, as selected memory cell data of memory block #B, L level data is read. Further, by the write currents of digit line DL and write bit line WBL, data is written to the selected memory cell in memory block #B.

In a cycle V, even when data writing and reading are simultaneously designated to the same address, as write bit line WBL and read bit line RBL are provided separately, accessing of writing and reading can be performed concurrently. Accordingly, in this case, when data of a selected memory cell is inverted during a read operation due to writing of data, or specifically when a memory cell changes from a high resistance state to a low resistance state (from Rmax to Rmin) in FIG. 16, the voltage level of read bit line RBL also changes and the logic level of internal data is determined in accordance with the amplitude change amount of read bit line and the magnitude of potential amplitude change of internal data line. In FIG. 16, H level data is read externally in cycle V.

As described above, by providing write bit line WBL and read bit line RBL separately, writing and reading can be performed in parallel even for the same address. Accordingly, for example, when performing data writing, a verification of whether write data has been correctly written to a selected memory cell can reliably be performed. Further, by performing a write operation with a delayed phase relative to a reading operation, data writing is performed after completion of data reading. Thus, a so-called "read-modify-write" operation can be implemented. Accordingly, for example, by reading the data stored in a memory cell and determining the logic level thereof, and by writing the data only when storage data of selected memory cell has a logic level opposite to that of the write data, it is not necessary to newly write the write data of the same logic level as data already stored, whereby power consumption in data writing can be reduced.

It is noted that read bit line RBL is initialized to a reference voltage level such as a ground voltage, in data reading. For a configuration of initializing read bit line RBL of non-selected state to a reference potential such as a ground voltage, a configuration may be employed, for example where a high resistance element such as a pull-down resistor is connected between each read bit line RBL and the ground node. Alternatively, in precharge circuit PCK, a resetting MOS transistor that is made conductive complementary to MOS transistor NTa may be provided for each read bit line, so that the resetting MOS transistor couples the non-selected read bit line to the ground node.

Figure 17:
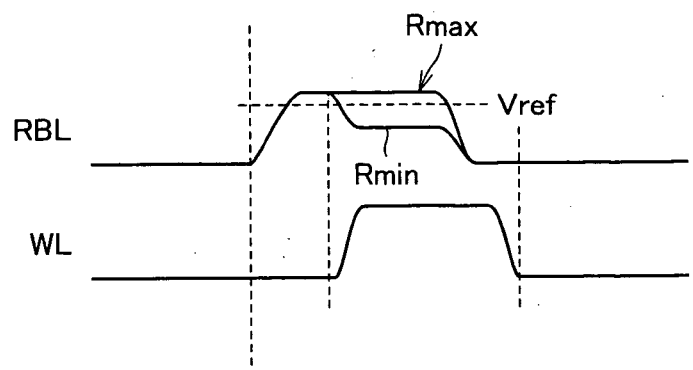
FIG. 17 schematically shows a precharge scheme of a modification of the third embodiment of the present invention.

FIG. 17 schematically shows a modification of read bit line precharge timing according to the third embodiment of the present invention. In the precharge timing shown in FIG. 17, after read bit line RBL is supplied with a precharge voltage, word line WL is driven to selected state. Since precharge voltage Vpr is supplied to selected read bit line RBL when word line WL is in non-selected state, irrespective of storage data of a selected memory cell, read bit line RBL is precharged as the memory cell transistor is in an off state, whereby its voltage level rises to attain a prescribed precharge voltage level. Then, when word line WL is driven to selected state, a memory cell current flows in accordance with storage data of the memory cell, that is, resistance value Rmax or Rmin of a variable magneto-resistance element, and the potential of read bit line RBL is driven to a high level or a low level corresponding to storage data, relative to reference voltage Vref that is an intermediate value between H data and L data.

Further, after completing (stopping) the supply of precharge current to read bit line RBL, by driving word line WL to non-select state, read bit line RBL is discharged to the ground node through the selected memory cell, and the selected read bit line can reliably be driven to non-select state at a faster timing.

Still further, a precharge circuit and a primary amplifier forming a pair are connected to common read bit line RBL. In this case, there is a possibility that a precharge voltage is supplied to selected read bit line RBL, and MOS transistor NTb of the primary amplifier enters a strong on state at an early stage of precharge by this precharge voltage. However, since a memory cell current flows when a memory cell is driven to selected state, and the potentials of read bit lines and internal data lines fall irrespective of whether storage data is H level (data "1") or L level (data "0"), the time period during which the transistor NTb of the primary amplifier is in the strong on state is short. Accordingly, the read bit line and the internal data line can immediately be driven to the potential level corresponding to storage data, and an erroneous reading may not occur in data reading. Accordingly, no problem is caused in operation when the primary amplifier and the precharge circuit are connected to a common read bit line.

First Modification

Figure 18:
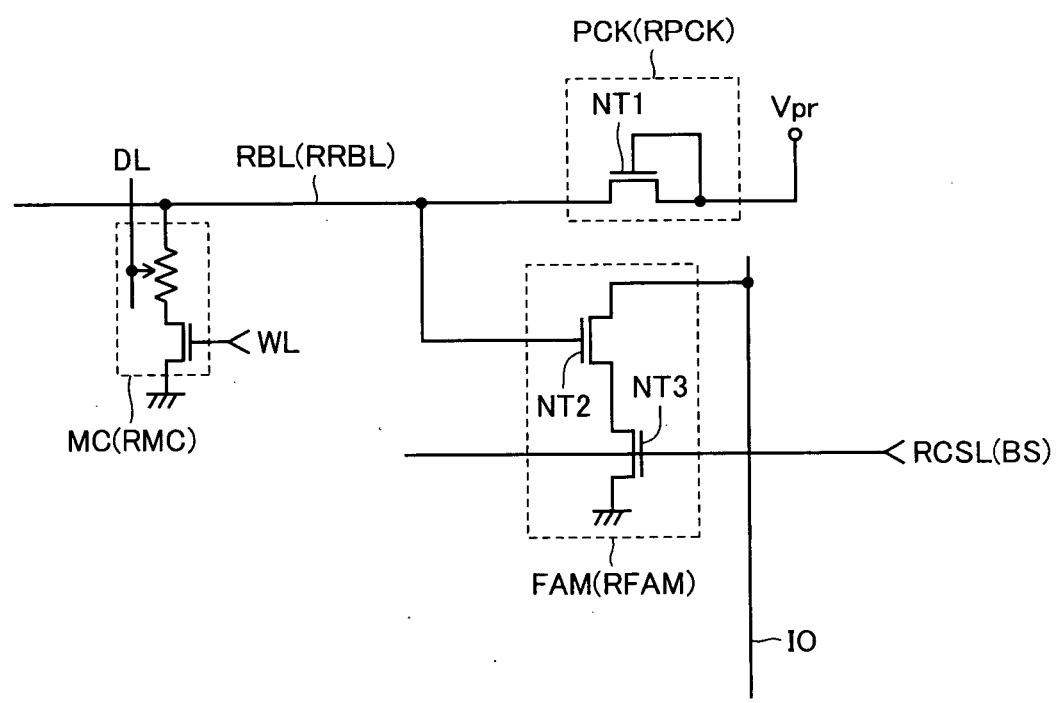
FIG. 18 shows a configuration of another modification of the third embodiment of the present invention.

FIG. 18 shows a configuration of a modification of the third embodiment of the present invention. In FIG. 18, a configuration of precharge circuit PCK for precharging a read bit line and primary amplifier FAM for reading a signal potential of the read bit line is shown. The configuration of the remaining of array portion is the same as that shown in FIG. 15.

Precharge circuit PCK includes a diode-connected N channel MOS transistor NT1 transmitting precharge voltage Vpr-Vth constantly to corresponding read bit line RBL. Vth indicates a threshold voltage of MOS transistor NT1.

Primary amplifier FAM includes N channel MOS transistors NT2 and NT3 serially connected between internal data line IO and a reference potential node (ground node). The gate of MOS transistor NT2 is connected to read bit line RBL, and select signal RCSL from read selector RSA shown in FIG. 15 is applied to the gate of MOS transistor NT3. MOS transistor NT2 drives internal data line IO in accordance with the potential on read bit line RBL when MOS transistor NT3 is made conductive.

A precharge circuit and a primary amplifier configured similarly to precharge circuit PCK and primary amplifier FAM are provided to reference read bit line RRBL shown in FIG. 15. In FIG. 18, reference characters indicated in parentheses denote precharge circuit RPCK and primary amplifier RFAM provided for the reference read bit line, thereby indicating that the similar configuration is employed also for dummy cell RMC.

In the configuration shown in FIG. 18, to read bit line RBL, a precharge voltage is constantly supplied by precharge circuit PCK. Accordingly, a period for supplying a precharge voltage to read bit line RBL is not necessary, thus fast accessing is achieved.

Figure 19:
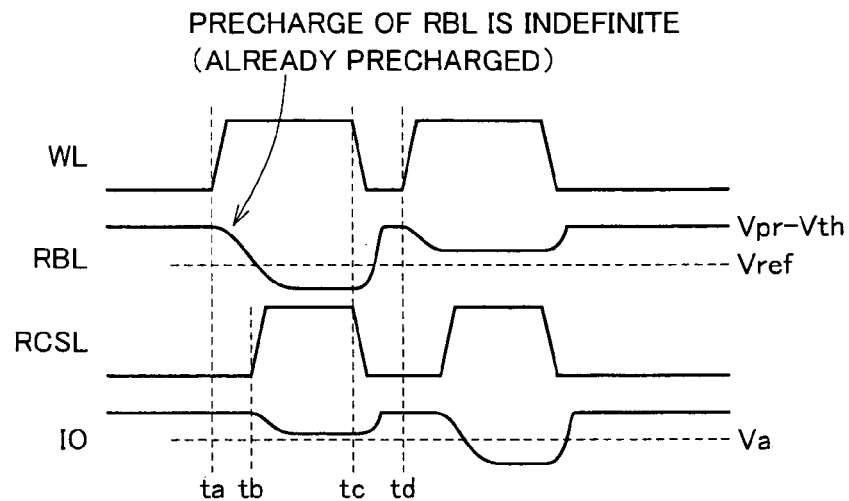
FIG. 19 is a timing diagram representing an operation of the configuration shown in FIG. 18.

FIG. 19 schematically shows signal waveforms in data reading according to the first modification. In FIG. 19, before time ta, word line WL is in non-selected state, and read bit line RBL is precharged to and maintained at a prescribed precharge voltage (Vpr-Vth) level. Internal data line 10 is also precharged to a prescribed voltage (for example, power supply voltage VCC or VCC-Vth level).

At time ta, a read cycle starts and word line WL is driven to selected state. In response, a select transistor of memory cell MC is made conductive, and a current path is formed from read bit line RBL to a source line via a variable magneto-resistance element. When the resistance value of the variable magneto-resistance element of memory cell MC is small or when resistance value is Rmin, a large current flows from read bit line RBL to a source node, whereby the potential of read bit line RBL lowers.

At time tb, read select signal RCSL from the read selector shown in FIG. 15 is driven to a selected state, primary amplifier FAM (RFAM) is activated, and MOS transistor NT2 therein drives internal data line IO in accordance with the potential of read bit line RBL. At time tb, the selected memory cell has resistance value Rmin. The potential drop of the selected read bit line RBL is large and the potential thereof is not higher than reference potential Vref Therefore, internal data line IO is small in potential drop and has the potential higher than reference potential Va.

In parallel to the operation of selecting memory cell MC, in reference memory block (an adjacent memory block), an operation of selecting reference memory cells RMC (RMCmax and RMCmin) is performed. Reference cell data is read by corresponding precharge circuit RPCK and primary amplifier RFAM in the adjacent memory block, and is compared with the memory cell data read on internal data line IO by amplifier circuits AMPF0, AMPF1 and AMPS shown in FIG. 15, and thus data reading is performed.

At time tc when one read cycle is completed, word line WL is driven to non-selected state. The select transistor is made non-conductive in memory cell MC to shut off the current path in memory cell MC. Read bit line RBL is precharged to the original precharge voltage (Vpr-Vth) level by precharge circuit PCK. Additionally, primary amplifier FAM is also deactivated, and reading of internal data to the internal data line is completed. Internal data line IO is precharged to the prescribed precharge voltage level by an internal data line precharge circuit, not shown.

At time td, next data read cycle is started. At the beginning of the cycle from time td, read bit line RBL has already been returned to a prescribed precharge voltage level, and the potential of read bit line RBL changes in accordance with storage data (resistance value Rmax) of the selected memory cell. In this case, the resistance value of the variable magneto-resistance element of the memory cell is Rmax, and the potential drop amount of read bit line RBL is small. Accordingly, when read select signal RCSL is driven to selected state and primary amplifier FAM is activated, the potential of internal data line IO being driven by MOS transistor NT2 of the primary amplifier drops significantly, and therefore the potential of internal data line IO drops to a voltage level lower than reference potential Va.

As shown in FIG. 18, by setting precharge circuit TCK to an operating state constantly, and selectively activating the primary amplifier according to a read select signal, it is not necessary to include a period for precharging read bit line RBL in a read cycle period, whereby the access time can be reduced. In particular, even if the next read cycle is started before a read bit line returns to a prescribed precharge voltage level, a correct data reading can be performed if the read bit line attains the voltage level where a memory cell current and a precharge current are balanced by a reading timing (a timing of driving the internal data line or a timing of activating the first stage amplifier). Thus, correct data reading can be performed even with a static operation to the read bit line without providing any precharge period. Thus, the cycle period can be reduced.

Figure 20:
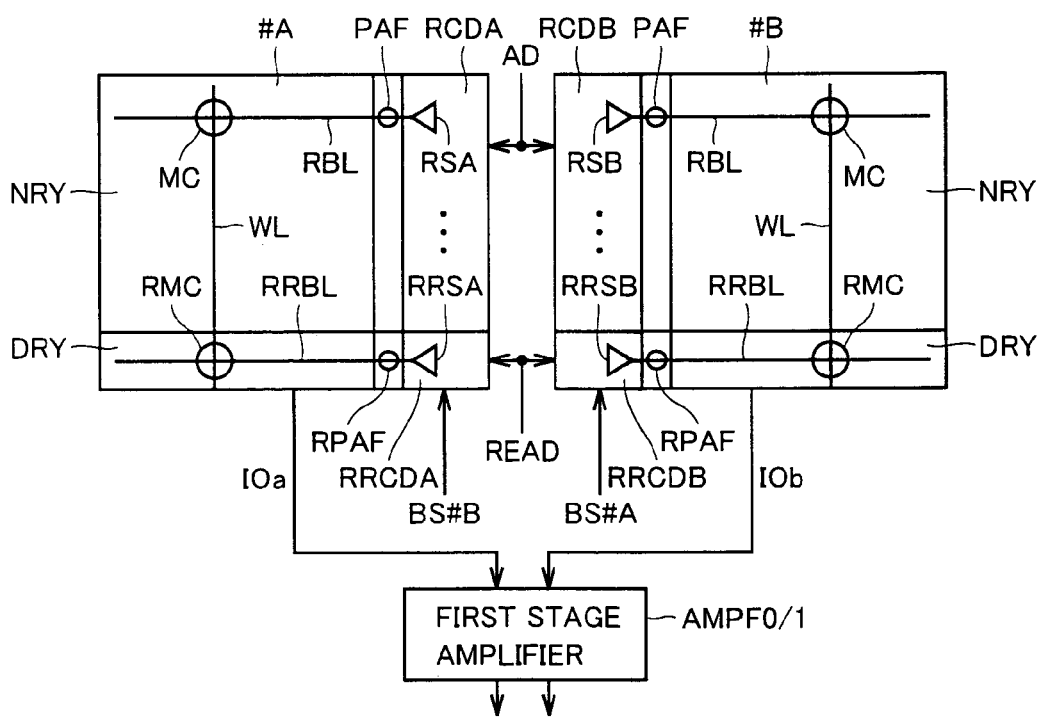
FIG. 20 schematically shows a configuration of an array portion of the non-volatile semiconductor memory device according to the third embodiment of the present invention.

FIG. 20 schematically shows a configuration of an array portion of the non-volatile semiconductor memory device according to the third embodiment of the present invention. In FIG. 20, two memory blocks #A and #B are provided. Memory blocks #A and #B each include a normal cell array NRY where memory cells MC are arranged and a dummy memory cell array DRY where dummy cells RMC (reference cell RMCmax and RMCmin) are arranged. In each normal array NRY of memory blocks #A and #B, memory cells (normal cells) MC are arranged in rows and columns, while in dummy cell array DRY dummy cells RMC are arranged aligned with normal cells. Although in dummy cell array DRY, reference cells RMCmx and RMCmn are arranged in two rows, these reference cells are representatively shown by dummy cell RMC in FIG. 20.

In normal cell array NRY, read bit line RBL is arranged corresponding to memory cell MC. In Dummy cell array DRY, reference read bit line RRBL is arranged corresponding to dummy cell RMC.

In each of memory blocks #A and #B, word line WL shared by memory cell MC and reference cell RMC is arranged in a direction perpendicular to read bit lines RBL and RRBL. Accordingly, a memory cell MC and a dummy cell RMC are simultaneously selected by a word line WL.

To memory block #A, there are provided a read bit line select circuit RCDA for selecting a read bit line in accordance with address signal AD and a reference bit line select circuit RRCDA for selecting a reference read bit line RRBL in accordance with block select signal BS#B. Read bit line select circuit RCDA includes a read selector RSA provided corresponding to each read bit line RBL and generating a read bit line select signal in accordance with an address signal. Reference bit line select circuit RRSA includes a reference bit line select circuit RRSA that generates a signal selecting reference read bit line RRBL in accordance with block select signal BS#B and read instruct signal READ. Block select signal BS#B specifies memory block #B when activated.

Similarly, to memory block #B also, there are provided a read bit line select circuit RCDB and a reference bit line select circuit RRCDB. Read bit line select circuit RRCDB is arranged corresponding to each read bit line RBL, and includes read selector RSB for generating a signal selecting read bit line RBL in accordance with address signal AD. Reference bit line select circuit RRCDB includes reference bit line selector RRSB that generates a signal for driving reference bit line RRBL to selected state in accordance with block select signal BS#A and read instruct signal READ. Block select signal BS#A specifies memory block #A when activated.

In each of memory blocks #A and #B, for read bit line RBL and reference read bit line RRBL, precharge/amplifier circuits PAF and RPAF are provided, respectively. Precharge/amplifier circuits PAF and RPAF include precharge circuit PCK and amplifier circuit (primary amplifier) FAM shown in FIG. 15 or FIG. 18.

Reference bit line RRBL is driven to selected state when block select signal BS#B or BS#A is activated. When memory cell MC is selected to read data in memory block #A, reference read bit line RRBL is activated in memory block #B, and according to dummy cell RMC, a signal of an intermediate potential level is transmitted on internal data line IOb, while a signal potential level corresponding to data stored in selected memory cell MC is transmitted on internal data line IOa. In memory block #A, when memory cell MC is selected, word line WL is driven to a selected state, and similarly, read bit line RBL is also driven to a selected state. In memory block #B, word line WL is driven to a selected state, and reading of storage data of dummy cell RMC is performed. Here, read bit line RBL maintains non-selected state. Thus, in internal data line IOb, collision of storage data of memory cell MC and storage data of dummy cell RMC (average value data) are prevented.

Internal data line IOa and IOb are coupled to first stage amplifier circuit AMPF0/1. First stage amplifier circuit AMPF0/1 corresponds to first stage amplifiers AMPF0 and AMPF1 shown in FIG. 15. Complementary signals from first stage amplifier AMPF0/1 are transmitted to an amplifier (read amplifier) AMPS of the subsequent stage (see FIG. 15).

As shown in FIG. 20, by providing two memory blocks #A and #B and using one of the memory blocks as a region for generating reference data when reading selected memory cell data, common phase noises are generated when noises are generated in memory blocks #A and #B. Accordingly, these noise components are cancelled at first stage amplifier AMPF0/1 and correct data reading can be performed.

A configuration in which read selector RSA or RSB is selectively activated in read line select circuit RCDA or RCDB is implemented by simply using block select signal BS#A and BS#B, and read bit line RBL can be activated by activating the read selector, only for the memory block including a selected memory cell.

Array Configuration 2

Figure 21:
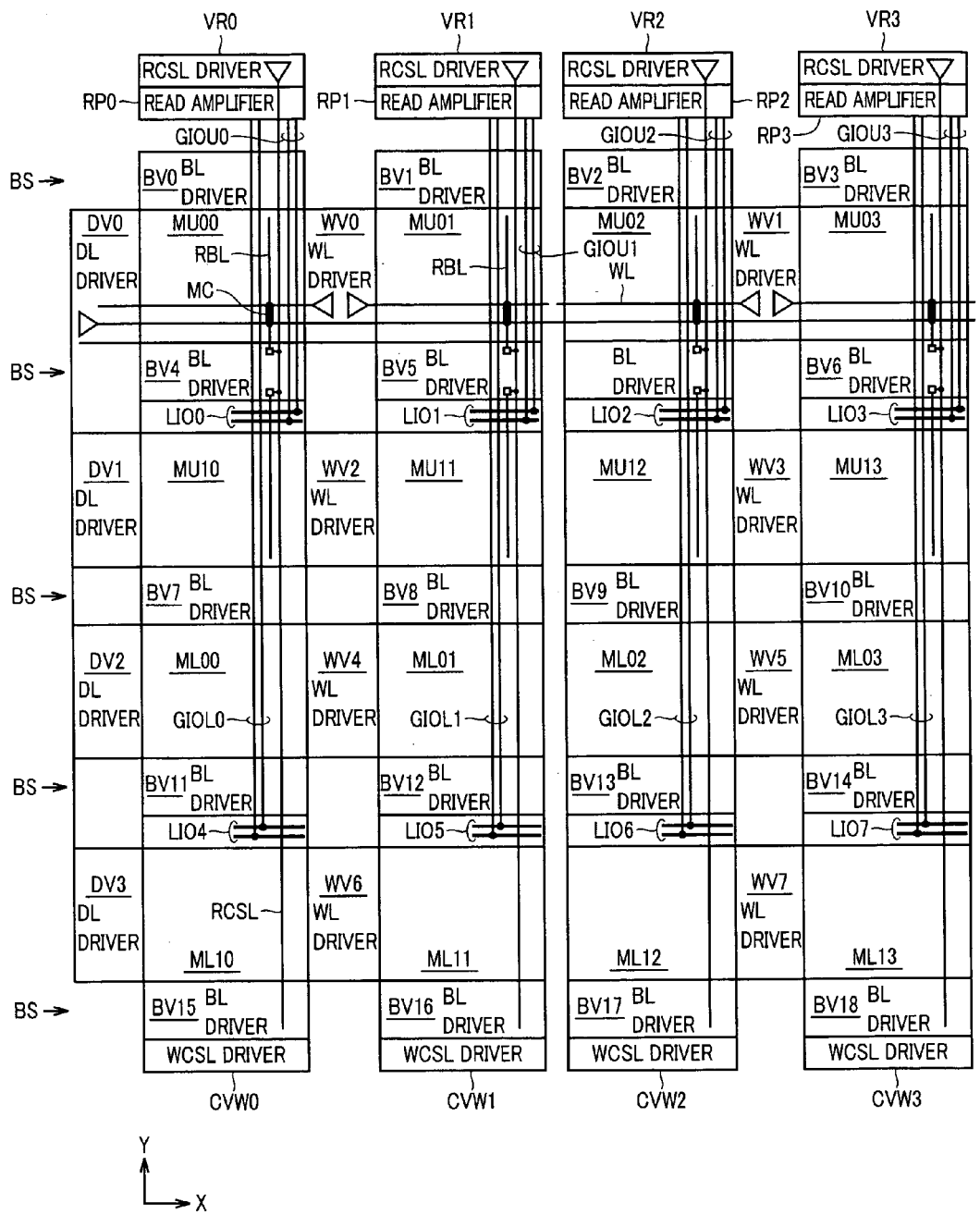
FIG. 21 schematically shows a modification of the array portion of the non-volatile semiconductor memory device according to the third embodiment of the present invention.

FIG. 21 schematically shows another modification of a configuration of the array portion of the non-volatile semiconductor memory device according to the third embodiment of the present invention. In FIG. 21, the memory array includes a plurality of memory blocks MUij (i=0-1, j=0-3) and MLij. In each memory block MUij, read bit line RBL and word line WL are arranged perpendicularly to each other. Memory cell MC is arranged corresponding to an intersection of word line WL and read bit line RBL. In FIG. 21, although not explicitly shown, a write bit line is arranged in parallel to read bit line RBL.

Corresponding to memory blocks MUi0-MUi3 aligned in X direction in FIG. 21, a DL driver DVi for driving a digit line is provided. Digit line DL is arranged continuously extending so as to be shared by memory blocks MUi0-MUi3 aligned in X direction. Digit line DL is formed of a metal interconnection line, has the resistance value made small, and therefore is activated in a short time period. On the other hand, word line WL is required to be driven to a selected state in a short time period, but the resistance value of its gate electrode interconnection forming the word line is greater than that of the metal interconnection line of digit line DL, as it is configured of, for example, polysilicon. Word line WL is provided for each memory block, to be made short for reducing the interconnection resistance (the load of a word line driver).

Between the memory blocks aligned in X direction, a word line driver WV is arranged. Word line drivers WV0-WV7 are each shared by memory blocks adjacent to each other in X direction, and respectively drives word lines WL of corresponding memory blocks through word line drive circuits. By providing the word line drive circuit corresponding to each memory block, word line WL is driven to selected state in a short time period.

Between the memory blocks adjacent to each other in Y direction, a BL (bit line) drive circuit supplying a bit line write current is arranged. In FIG. 21, BL drive circuits BV0-BV18 are arranged in the respective regions between adjacent memory blocks among memory blocks MU00-MU13 and ML00-ML13 and in regions external to the memory array. BL drive circuits BV0-BV18 each drive a write bit line, which is not explicitly shown in FIG. 21, from the opposing sides, for supplying a bit line write current. In BL drive circuits BV4-BV14 arranged between adjacent memory blocks in Y direction, precharge/amplifier circuit PAF is arranged to precharge a selected read bit line and to amplify read data when read bit line RBL is selected. Precharge/amplifier circuit PAF is selectively activated in accordance with a block select signal BS specifying memory blocks aligned in X direction.

A read column select line RCSL is arranged commonly to memory blocks aligned in Y direction, for example, memory blocks MU00, MU10, ML00, and ML10. Read column select signal lines RCSL are coupled to precharge/amplifier circuits PAF provided respectively to BL drive circuits BV4-BV14. In a select memory block, precharge/amplifier circuit PAF is enabled in accordance with a signal on read column select signal line RCSL.

WCSL drivers CVW0-CVW3 driving write bit select signal WCSL for selecting a write bit line are arranged opposing to RCLSL drivers VR0-VR3, respectively, on an array edge portion. However, a write bit line in each memory cell block is not shown in FIG. 21. A write bit line select signal line is arranged extending in column direction over a memory array. In parallel to the read bit line, a write bit line is arranged in each block. In a selected block, data writing is performed in accordance with the write column select signal and write data.

A local data line pair LIO is arranged between adjacent memory blocks in Y direction. Specifically, a local data line pair LIO0 is arranged between memory blocks MU00 and MU10; a local data line pair LIO1 is arranged between memory blocks MU01 and MU11; a local data line pair LIO2 is arranged between memory blocks MU02 and MU12; and a local data line pair LIO3 is arranged between memory blocks MU03 and MU13. In the respective regions between memory blocks ML00-ML03 and memory blocks ML10-ML13, local data line pairs LIO4-LIO7 are arranged corresponding to the memory blocks.

Local data line pairs LIO0-LIO7 are shared by memory blocks on both sides in Y direction.

Local data line pairs LIO0-LIO3 are coupled to global data line pairs GIOU0-GIOU3 extending in Y direction, respectively, and local data line pairs LIO4-LIO7 are connected to global data line pairs GIOL0-GIOL3 extending in Y direction, respectively.

Global data line pairs GIOL0-GIOL3 and GIOU0-GIOU3 are coupled to read amplifiers RP0-RP3, respectively. To each of local data line pairs LIO0-LIO7, complementary signals of 1 bit are transmitted in parallel. Accordingly, signals of 8 bits in total are read in parallel.

In memory blocks adjacent in Y direction, data reading of a selected memory cell is performed in one memory block, while the other memory block is used as a reference block for generating reference data. Accordingly, on local data line pair LIO, complementary signals (output signals of first stage amplifiers) corresponding to a result of the comparison between a signal of the reference data line and data of the selected memory cell are generated (see FIG. 15).

Figure 22:
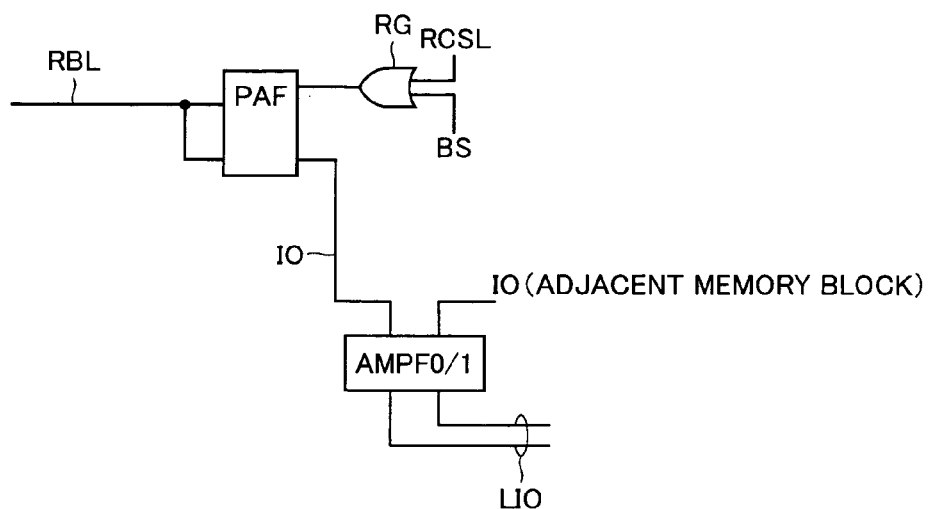
FIG. 22 schematically shows a configuration of a portion related to a local data line pair shown in FIG. 21.

FIG. 22 schematically shows a configuration of the arrangement region of local data line pair LIO shown in FIG. 21. In the configuration shown in FIG. 22, precharge/amplifier circuit PAF provided for read bit line RBL is driven to a selected state by read select gate RG corresponding to read selector RSA. Read select gate RG generates a local read bit line select signal to corresponding read bit line RBL in accordance with a signal on corresponding read column select signal line RCSL and block select signal BS.

Precharge/amplifier circuit PAF supplies a precharge voltage to corresponding read bit line RBL in accordance with a read bit line select signal from read select gate RG, and drives internal data line IO in accordance with data from a selected memory cell. Internal data line IO is coupled to first stage amplifier AMPF0/1 together with internal data line IO from an adjacent memory block. First stage amplifier circuit AMPF0/1 drives corresponding local data line pair LIO in accordance with a comparing result of read data and the reference potential.

Figure 23:
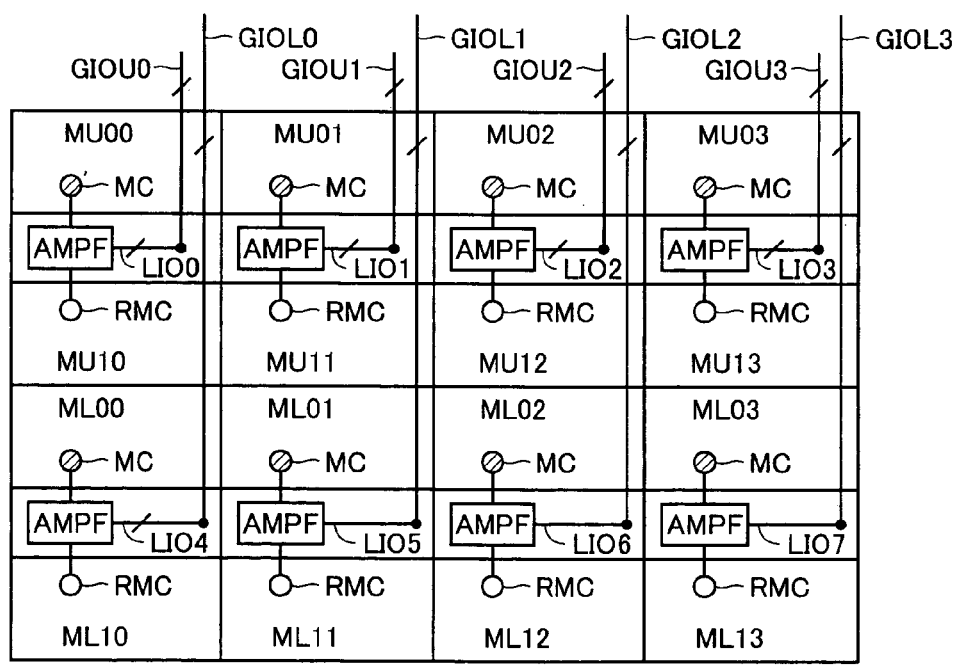
FIG. 23 schematically shows a distribution of selected memory cells in the array configuration shown in FIG. 21.

FIG. 23 schematically shows distribution of selected memory cells in data reading in the memory cell array configuration shown in FIG. 21. In FIG. 23, memory cells MC are selected in memory blocks MU00-MU03 and ML00-ML03. In memory blocks MU10-MU03 and ML10-ML13, dummy cells RMC are selected and data of the selected dummy cells are read.

For local data line pairs LIO0-LIO3 and LIO4-LIO7, first stage amplifier circuits AMPF (AMPF0/1) amplifying data from internal data lines are provided, respectively, which differentially amplify data from memory cells MC and dummy cells RMC of corresponding memory blocks, to drive corresponding local data line pairs LIO0-LIO7 in accordance with the amplification result.

Local data line pairs LIO-LIO3 are coupled to global data line pairs GIOU0-GIOU3, respectively, while local data line pairs LIO4-LIO7 are coupled to global data line pairs GIOL0-GIOL3, respectively. Accordingly, as shown in FIG. 23, reading of 8-bit data is performed in the array configuration shown in FIG. 21.

Even in a case where read bit line RBL does not have a folded bit line structure as in DRAM (Dynamic Random Access Memory), by selecting a reference cell in an adjacent non-selected memory block and generating reference data, a complementary signal line structure can equivalently be implemented, and thus data reading with excellent noise immunity can be achieved.

As described above, according to the third embodiment of the present invention, as write bit lines and read bit lines are separately provided, and a precharge/amplifier circuit is provided for each read bit line, a memory cell current flowing each read bit line is not required to drive an internal data 1 with large load and reading of internal data can be performed at high speed. Additionally, the load of a read bit line is alleviated, and thus the potential of read bit line can be changed at high speed.

Fourth Embodiment

Figure 24:
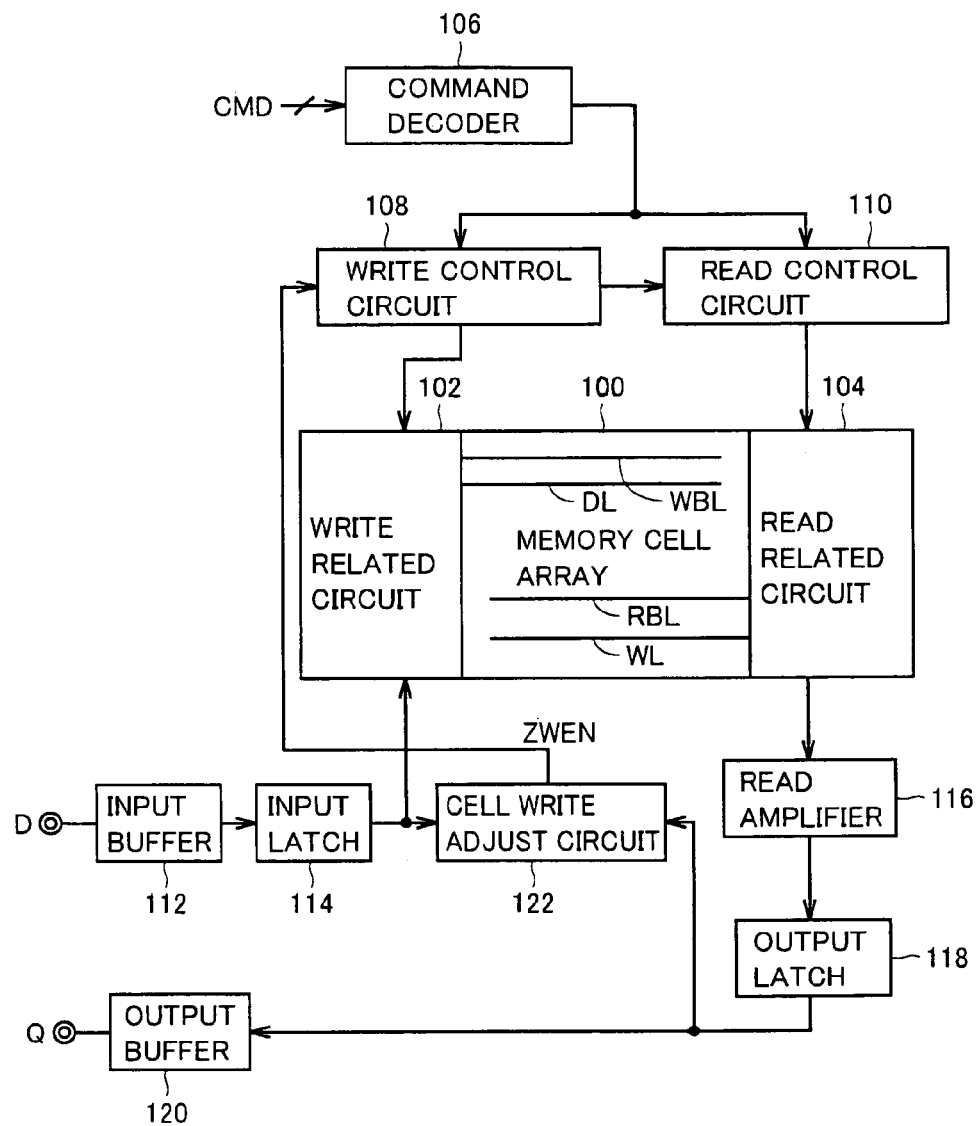
FIG. 24 schematically shows an overall configuration of a non-volatile semiconductor memory device according to a fourth embodiment of the present invention.

FIG. 24 schematically shows an overall configuration of a non-volatile semiconductor memory device according to a fourth embodiment of the present invention. In FIG. 24, the non-volatile semiconductor memory device includes a memory cell array 100 having memory cells arranged in rows and columns, a write related circuit 102 for performing data writing to a selected memory cell in memory cell array 100, and a read related circuit 104 for performing data reading from a selected memory cell in memory cell array 100.

In memory cells, a storage element is comprised of a TMR element, for example. In memory cell array 100, a write bit line WBL, a digit line DL, a read bit line RBL, and a word line WL are arranged. Memory array 100 is divided into a plurality of memory blocks, and includes memory cells and reference cells. For reference cells, reference read bit lines and reference write bit lines are arranged. However, for the purpose of simplification of the drawing, the signal lines to the reference cells are not shown in FIG. 24.

Write related circuit 102 includes a write bit line driver provided for write bit line WBL and a digit line driver provided for digit line DL, and read related circuit 104 includes a precharge circuit for supplying a precharge voltage to read bit line RBL, a primary amplifier for reading a signal potential of a read bit line onto an internal data line, and a word line driver for driving word line WL. Read related circuit 104 further includes a precharge circuit and a primary amplifier for a reference cell, and a first stage amplifier circuit for amplifying data read onto the internal data line and generating internal read data.

The non-volatile semiconductor memory device further includes a command decoder 106 that decodes a command CMD supplied externally for specifying an operation mode to generates an internal operation control signal indicative of the specified operation mode, a write control circuit 108 for controlling an operation of the write related circuit according to a write mode instruct signal from command decoder 106, and a read control circuit 110 for controlling an operation of read related circuit 104 according to a read mode instructing signal from command decoder 106.

Command CMD includes a chip select signal, a write command and a read command supplied synchronously with an externally applied clock signal CLK. However, this command CMD may be an operation mode instructing signal subject to decoding.

The non-volatile semiconductor memory device further includes an input buffer 112 for latching externally supplied write data D and generating an internal write signal, an input latch 114 for latching the internal write data received from input buffer 112, a read amplifier 116 for amplifying internal read data read by read related circuit 104, an output latch 118 for latching data amplified by read amplifier 116, an output buffer 120 for outputting, as external read data Q, the signal latched by output latch 118 at a prescribed timing in synchronization with, for example, a clock signal, and a cell write adjust circuit 122 for determining match/mismatch of logic levels of data latched respectively by input latch 114 and output latch 118 and generating a mode adjust signal based on the determination result.

Read amplifier 116 corresponds to final stage amplifier AMPS in the first embodiment.

While input buffer 112, input latch 114, read amplifier 116, output latch 118, and output buffer 120 have their operation timing determined according to operation mode control signals outputted from write control circuit 108 and read control circuit 110, such signal paths are not shown in FIG. 24.

Cell write adjust circuit 122 controls a write operation on a selected memory cell according to match/mismatch of the logic levels of data stored in input latch 114 and output latch 118, and implements a so-called "read-verify-write" mode of operation.

This read-verify-write operation is an operation mode where, in data writing, the data of the memory cell of an access target is read internally, and when the logic level of write data held in input latch 114 matches that of data latched by output latch 118, writing of data D is stopped. In this case, cell write adjust circuit 122 generates a write prohibit signal to write control circuit 108. In this operation, write control circuit 108 may output a flag externally to indicate that the data writing has been performed (a path thereof is not shown).

In this case, rewriting of the data the same in logic level as the data already written is prevented, and therefore current consumption in data writing can be reduced.

First Modification

Figure 25:
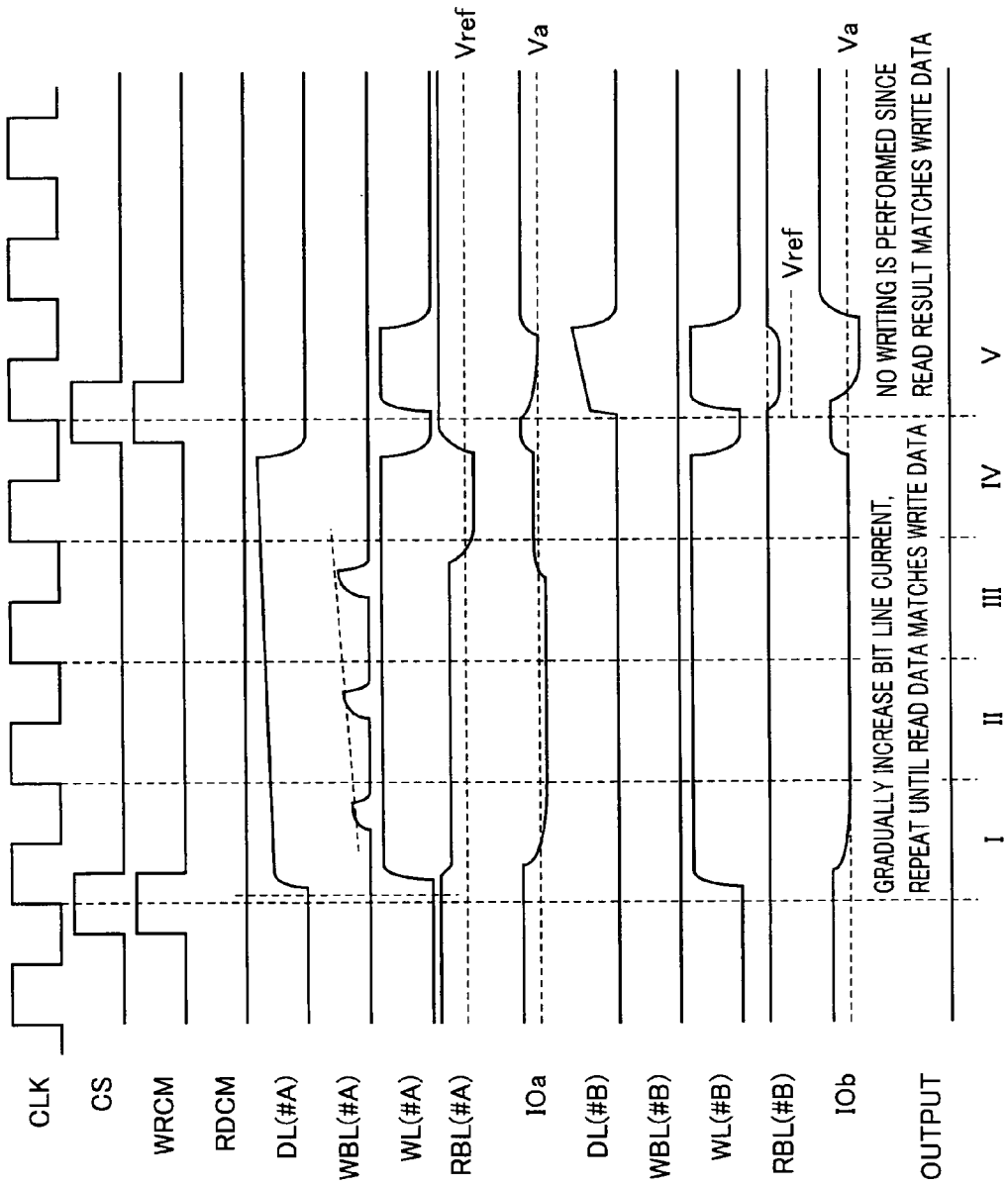
FIG. 25 is a timing diagram representing an operation of the non-volatile semiconductor memory device shown in FIG. 24.

FIG. 25 is a timing diagram representing an operation of a first modification of cell write adjust circuit 122 of the fourth embodiment of the present invention. In the following, an operation in data writing of the non-volatile semiconductor memory device shown in FIG. 24 will be described with reference to FIG. 25.

The internal configuration of memory cell array 100 is the same as that shown in the first embodiment. As to the overall configuration of the array, either the array configuration of the first embodiment or that of the modification thereof may be employed.

It is noted that, in the signal waveform diagram of FIG. 25, signal waveforms in data writing with the configuration including memory blocks #A and #B shown in FIG. 15 are shown.

In clock cycle I, data writing is instructed by externally supplied commands CS, WRCM and WDCM. When the data writing is designated, first, in selected memory block #A, a digit line write current is supplied to digit line DL. Thereafter, word line WL is driven to a selected state. Up to that time point, read bit line RBL has been precharged to a prescribed precharge voltage level, and has its potential changed according to storage data of the memory cell in accordance with word line WL being driven to the selected state. In this reading, a memory cell is selected according to an address signal specifying a memory cell of a writing target, and the memory cell of the data reading target and the memory cell of the data writing target are the same cell.

Since the selected memory cell is in the state of high resistance value Rmax and a memory cell current is small, read bit line RBL is maintained at a voltage level higher than reference voltage Vref. In this state, the conductance of MOS transistor of the first amplifier provided for read bit line RBL is large, and the potential of internal data line IOa drops below reference value Va.

A the selection of a reference cell is performed in memory block #B also, word line WL is driven to a selected state. Read bit line RBL maintains the precharge state, and a reference voltage at the level of reference value Va is transmitted to internal data line IOb. In this state, when the logic levels of write data and read data do not match, a relatively small write current is supplied to write bit line WBL as the first time writing, and the voltage level of write bit line WBL rises.

In clock cycle II also, a comparison operation of write data and internal read data is again performed. In this case also, the logic levels of write data and read data still do not match with each other, and a write bit line current to write bit line WBL is increased, and a write current to digit line DL is increased. Again, data writing to this selected memory cell is performed.

In clock cycle III also, the logic levels of write data and read data still do not match with each other. Therefore, again, a write current to write bit line WBL is increased, and data write to the memory cell is performed. The write current of digit line DL is successively and gradually increased until this write cycle is completed, and the potential of the digit line rises.

When writing is performed with an increased write current to write bit line WBL and the logic level of storage data of the memory cell is inverted, since the memory cell having resistance value Rmin is connected to read bit line RBL, the memory cell current increases and the potential level of read bit line RBL lowers. In accordance with the potential drop of read bit line RBL, the voltage level of internal data line IOa rises (the internal data line is provided with a pull-up resistor, and is pulled-up to a prescribed precharge voltage level).

Accordingly, in this clock cycle IV, while an increased write current is supplied to digit line DL, as the logic levels of internal read data and write data match with each other, supply of the write current to write bit line WBL is stopped. Thus, in clock cycle IV, data writing is completed.

When logic level matching is detected by cell write adjust circuit 122, the logic level match detection is instructed to write control circuit 108 (activate signal ZWEN), and the write operation by write related circuit 102 is completed by write control circuit 108.

In clock cycle V, data writing is again instructed. In this clock cycle V, data writing to a memory cell of memory block #B is specified. In this case, in memory block #B, digit line DL and word line WL are driven to a selected state. Accordingly, in memory block #B, a signal potential corresponding to storage data of selected memory cell appears in memory block #B. In memory block #B, the memory cell storing resistance value Rmin is selected, and the voltage level of internal data line IOb drops below reference value Va.

In memory block #A, word line WL is selected, and read bit line RBL is maintained at a precharge level of non-selected state. The reference cells (dummy cell) are selected, and internal data line IOa is driven to the voltage level of reference value Va. When the logic level of externally supplied write data matches that of internally read data, cell write adjust circuit 122 detects the matching and generates a signal ZWEN instructing write completion to write control circuit 108. In accordance with the write completion instructing signal, supply of a write current to write bit line WBL is not performed, and thus writing is completed.

When data the same in logic level as write data is already stored in the target memory cell, data writing is stopped to reduce the current consumption in data writing. In data writing also, whether write data is set to the logic level corresponding to the external data can reliably be determined, and data writing accompanied with the write verification can be achieved.

Further, write currents (for both of digit line and write bit line) are gradually increased in data writing. It is only required to increase the write currents until the logic level of write data matches a prescribed logic level, and it is not required to set the current value of the write currents to a desired value with high precision at an initial state. Therefore, the configuration of the circuitry for generating the write current can be simplified, as a constant current generating circuit of high precision is no longer required.

Figure 26:
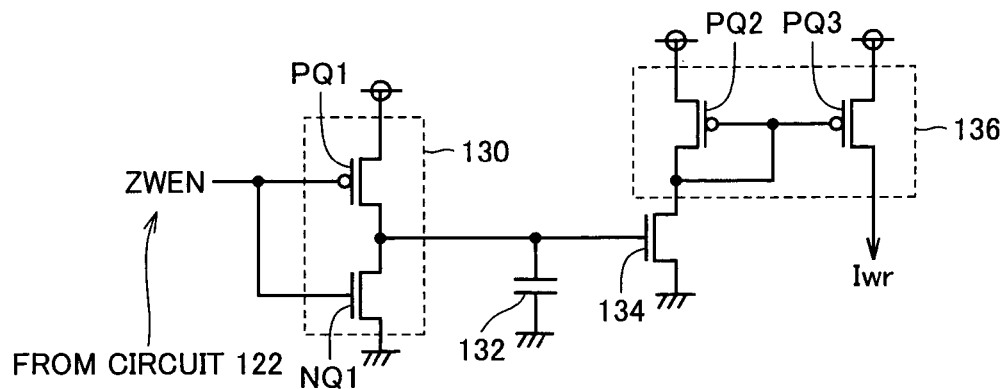
FIG. 26 shows an exemplary configuration of a portion for generating a write current of the non-volatile semiconductor memory device according to the fourth embodiment of the present invention.

FIG. 26 shows an exemplary configuration of a portion for generating a write current in this data writing. In FIG. 26, the write current generating portion includes a current driver 130 for supplying a current in accordance with write control signal ZWEN, a capacitive element 132 charged with a current from current driver 130, an N channel MOS transistor 134 having its driving current amount set by a charge potential of capacitive element 132, and a current source circuit 136 for generating a mirror current of a current flowing through MOS transistor 134 as a write current Iwr.

Current driver 130 includes MOS transistors PQ1 and NQ1 serially connected between a power supply node and a ground node and receiving write control signal ZWEN at their gates. Current driver 130 is substantially a CMOS inverter inverting write control signal ZWEN. When write control signal ZWEN is activated (at L level), current driver 130 has P channel MOS transistor PQ1 entering an on-state, and charges capacitive element 132. The charging speed of capacitive element 132 is determined by the on-resistance of MOS transistor PQ1 and the capacitance value of capacitive element 132. Accordingly, the charged potential of capacitive element 132 rises with a prescribed time constant. When stopping writing, write control signal ZWEN attains H level, current driver 130 is deactivated, and capacitive element 132 is discharged.

Current source circuit 136 includes a P channel MOS transistor PQ2 having its gate and drain connected to MOS transistor 134 and having its source connected to a power supply node, and a P channel MOS transistor PQ3 connected between a power supply node and an output node and having its gate connected to the gate of MOS transistor PQ2. MOS transistors PQ2 and PQ3 constitute a current mirror circuit, and a mirror current of a current flowing through MOS transistor PQ2, that is, a current flowing via MOS transistor 134 is generated as write current Iwr.

This write current Iwr may be a current supplied to a digit line, and it may be a current transmitted to a write bit line. By adjusting the mirror ratio of MOS transistors PQ2 and PQ3, the write current supplied to digit line DL and write bit line WBL is adjusted.

Figure 27:
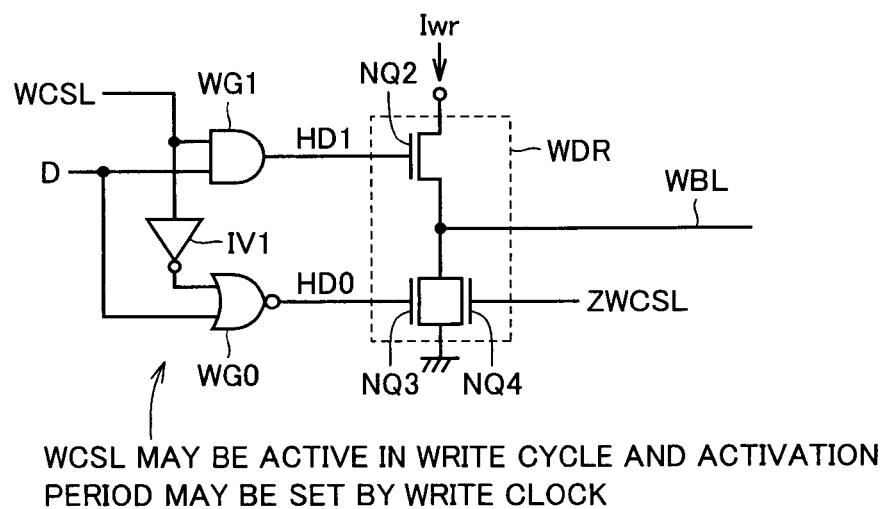
FIG. 27 shows an exemplary configuration of a portion for driving a write bit line in the non-volatile semiconductor memory device according to the fourth embodiment of the present invention.

FIG. 27 shows one exemplary configuration of a portion for generating a control signal to bit line write driver WDR. In the configuration shown in FIG. 27, bit line write driver WDR supplies a current to write bit line WBL when selected. Write driver WDR includes an N channel MOS transistor NQ2 for supplying write current Iwr to write bit line WBL when 1 write instruct signal HD1 is activated, an N channel MOS transistor NQ3 for discharging write bit line WBL when 0 write instruct signal HD0 is activated, and N channel MOS transistor NQ4 made conductive to maintain write bit line WBL at a ground voltage level when a complementary write column select signal ZWCSL is deactivated (when at H level).

The write instruct signal generating portion includes a write gate WG1 receiving write column select signal WCSL and write data D and generating 1 write instruct signal HD1, an inverter IV1 receiving write column select signal WCSL, and a write gate WG0 receiving an output signal of inverter IV1 and write data D to generate 0 write instruct signal HD0.

Write gate WG1 is configured by an AND circuit, and drives 1 write instruct signal HD1 to H level when write column select signal WCSL and write data D are both at H level. Write gate WG0 is configured by a NOR gate, and drives 0 write instruct signal HD0 to H level when write column select signal WCSL is at H level and write data D is at L level.

Accordingly, when write column select signal WCSL is at L level, 1 write instruct signal HD1 from write gate WG1 is at L level, and 0 write instruct signal HD0 of an output signal of write gate WG0 is also at L level. Here, complementary write column select signal ZWCSL is at H level, and write bit line WBL is maintained at ground voltage level by MOS transistor NQ4.

When write column select signal WCSL attains H level and corresponding write bit line is specified, 1 write instruct signal HD1 attains H level when write data D is at H level, and write current Iwr is supplied to write bit line WBL via MOS transistor NQ2. MOS transistor NQ4 is in off state as complementary write column select signal ZWCSL is at L level. When write data D is at H level, 0 write instruct signal HD0 is at L level, and MOS transistor NQ3 is in off state.

When write column select signal WCSL is at H level, if write data D is at L level, 0 write instruct signal HD0 from write gate WG0 attains H level, and 1 write instruct signal HD1 attains L level. Complementary write column select signal ZWCSL is at L level. Accordingly, write bit line WBL is coupled to ground node via MOS transistor NQ3.

To bit line write driver WDR, write current Iwr from the write current generating circuit shown in FIG. 26 is supplied. By activating write column select signal WCSL for each write cycle, the current supplied to write bit line WBL can gradually be increased.

A time period for supplying the write current to write bit line WBL is determined by write column select signal WCSL. However, such an alternative configuration may be employed, in which the activation duration period of write driver WDR is adjusted using a write control clock signal generated in a unit of a memory block, and write column select signal WCSL is constantly maintained at selected state during the write time period. In particular, when write column select signal WCSL propagates over the memory cell array for a long distance, the current consumption in charging and discharging of write column select signal WCSL can be reduced by using the write control clock signal.

As a configuration for driving word line WL to a selected state in data writing, the following configuration can be used. Specifically, when data write command WRCM is supplied, read control circuit 110 is activated based on a control signal from write control circuit 108 as shown in FIG. 24. Then, a word line drive circuit contained in read related circuit 104 is activated and word line WL is driven to selected state in accordance with a received address signal.

As described above, according to the configuration of the fourth embodiment of the present invention, in data writing, storage data of a write target memory cell is compared with write data, and based on the comparison result, the write operation to the write target memory cell is controlled. Thus, current consumption can be reduced, the precision of write current can be improved, and the margin of the write current can be increased.

Fifth Embodiment

Figure 28:
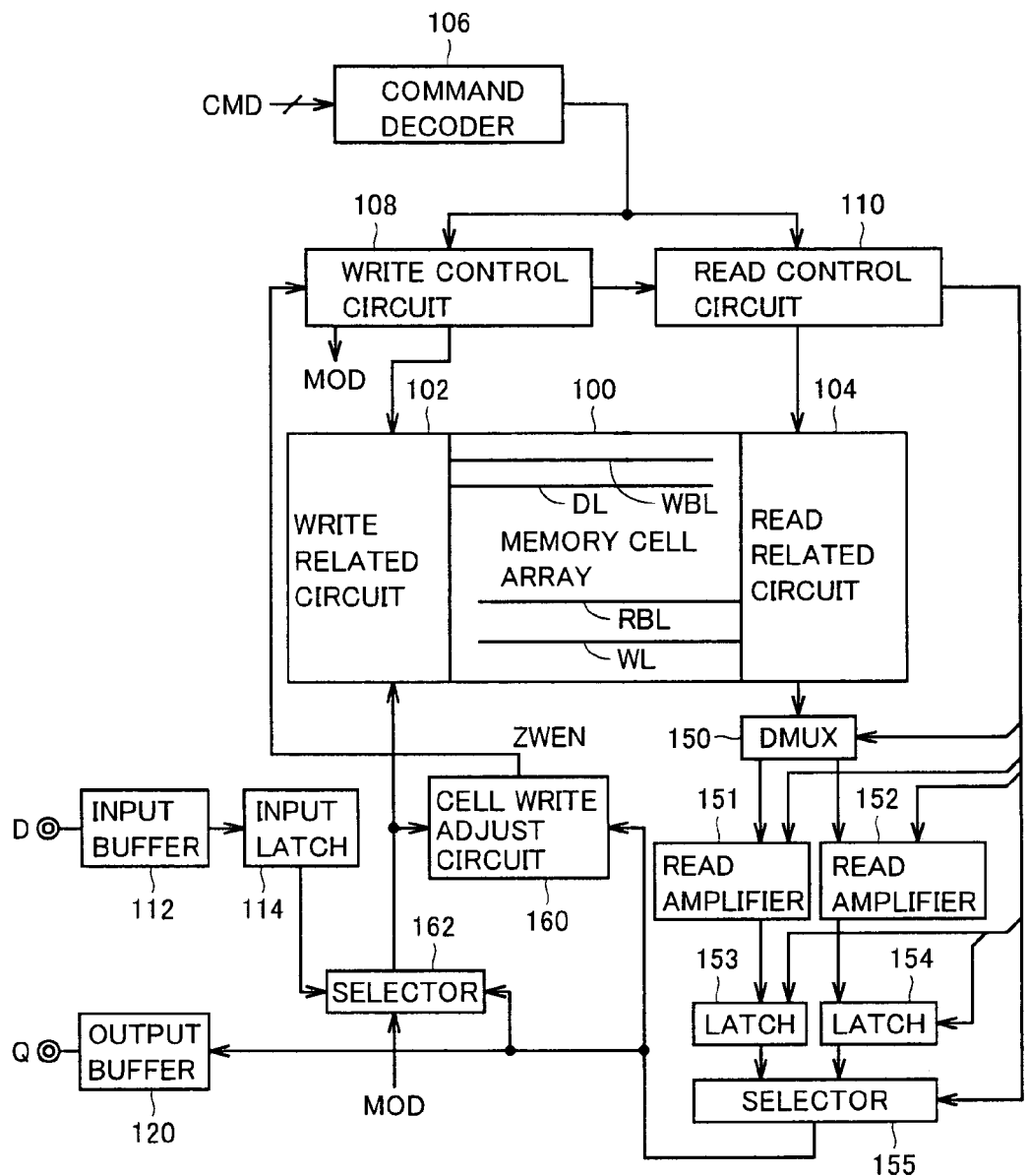
FIG. 28 schematically shows an overall configuration of a non-volatile semiconductor memory device according to a fifth embodiment of the present invention.

FIG. 28 schematically shows an overall configuration of a non-volatile semiconductor memory device according to a fifth embodiment of the present invention. In the non-volatile semiconductor memory device shown in FIG. 28, the configuration of the portion for performing writing and reading of internal data is different from that of the non-volatile semiconductor memory device shown in the fourth embodiment.

Specifically, the non-volatile semiconductor memory device shown in FIG. 28 includes, as internal data read related circuitry, a demultiplexer (DMUX) 150 for switching a transmission path of an output signal of first stage amplifiers (AMPF0, AMPF1) included in read related circuit 104, read amplifiers 151 and 152 for amplifying an output signal of demultiplexer 150 under control of read control circuit 110, latch circuits 153 and 154 latching the respective output signals of read amplifiers 151 and 152 in accordance with the output signal of read control circuit 110, and a selector 155 for selecting one of the output signals of latch circuits 153 and 154 under control of read control circuit 110.

As internal data write related circuitry, there are provided an input latch 114 for latching an internal signal from input buffer 112, a selector 162 for selecting one of latch data of input latch 114 and data selected by selector 155 in accordance with mode specify signal MOD and transmit the selected one to write related circuit 102 as write data, and a cell write adjust circuit 160 for generating write control signal ZWEN, in accordance with the logic level of data selected by selectors 155 and 162, to write control circuit 108.

The configuration of memory cell array 100, write related circuit 102 and read related circuit 104 is the same as that described in the fourth embodiment.

Write control circuit 108 controls various operations necessary for data writing according to an operation mode instructing signal from command decoder 106, and controls a write operation in accordance with write control signal ZWEN from cell write adjust circuit 160. When write control circuit 108 is further supplied with a write command instructing data writing and read command instructing data reading at the same time, if command CMD further specifies the read-modify-write mode, write control circuit 108 switches a connection path selected by selector 162 by mode instructing signal MOD. Specifically, in the read-modify-write operation mode, data internally read is selected by selector 162 and applied to cell write adjust circuit 160, and further supplied to write related circuit 102 as write data.

The non-volatile semiconductor memory device shown in FIG. 28 has its operation cycle defined by clock signal CLK, and in data writing mode operation, particularly each half cycle of the clock signal is defined as a data read period of time and as a data write period of time. Read amplifier 151 and latch circuit 153 are activated in the first half of cycle of the clock signal, while read amplifier 152 and latch circuit 154 are activated at an appropriate timing (in a period from the first half cycle over the second half cycle) in a normal reading mode in 1 clock cycle time.

Demultiplexer 150 transmits data read from read related circuit 104 to read amplifier 151 when data writing and data reading are to be performed in parallel, and transmits internal read data from read related circuit 104 to read amplifier 152 when normal data reading is to be performed (when only read command is supplied).

Selector 155 selects data latched by latch circuit 154 when only normal data reading is to be performed, and selector 155 is set to the state for selecting the latch data of latch circuit 153 when a write mode is instructed.

Figure 29:
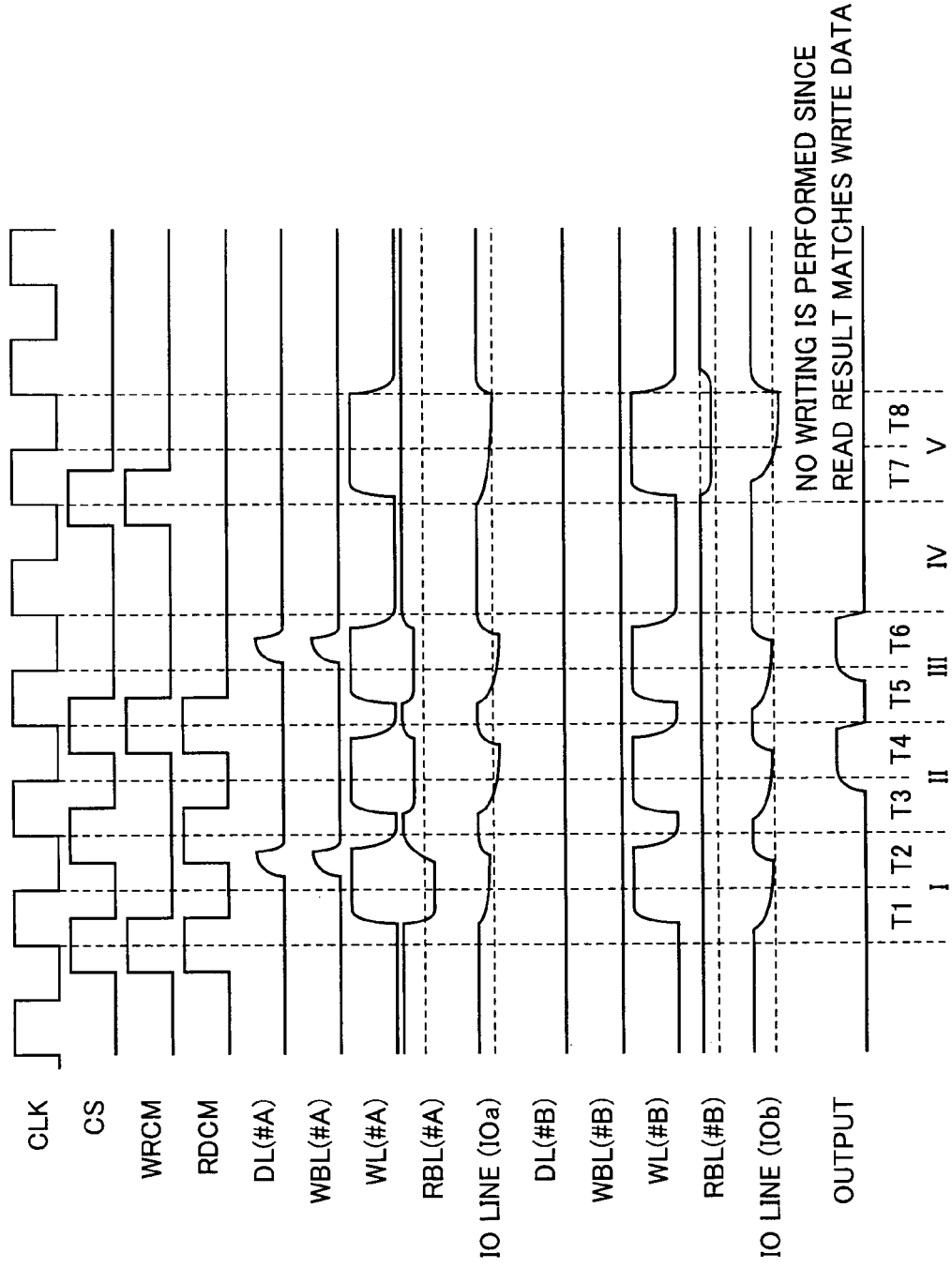
FIG. 29 is a timing diagram representing an operation of the non-volatile semiconductor memory device shown in FIG. 28.

FIG. 29 is a timing diagram representing an operation of the non-volatile semiconductor memory device shown in FIG. 28. In the following, data writing/reading operation of the non-volatile semiconductor memory device shown in FIG. 28 is described with reference to FIG. 29.

In cycle I, a data write mode and a read mode are simultaneously designated by write command WRCM and read command RDCM according to an externally supplied command. In this case, under control of read control circuit 110, read circuit 104 performs data reading in accordance with an externally applied address signal in the first half period T1 and drives a selected word line WL to a selected state. Additionally, read circuit 104 performs a precharging/amplifying operation on read bit line RBL.

FIG. 29 shows an operation, as one example, where a memory cell is selected in memory block #A and memory cell block #B generates reference data. Demultiplexer 150 transmits internal read data from read related circuit 104 to read amplifier 151 and the amplified internal data is latched by latch circuit 153. Selector 155 selects and output an output signal of latch 153.

In memory block #B, word line selection is performed and data reading of reference cell is performed. According to this reference data, internal read data line IOb is driven to the reference voltage level.

In the second half cycle of cycle I, data writing to memory block #A is performed according to write command WRCM, a write current is supplied to a selected digit line DL and a selected write bit line WBL, and data writing to the memory cell of write target is performed. In this case, selector 162 selects and applies data from input latch 114 to write related circuit 102. Since cell write adjust circuit 160 is supplied with the read command and the write command concurrently, a rewrite adjustment operation of data is not performed, and write control signal ZWEN maintains an inactive state. In this case, in place of the write current generating circuit shown in FIG. 26, a write current from another constant current source is supplied to each of the digit line and the write bit line.

In this operation mode, an address signal may be the same for data writing and for data reading, or it may be different between these operation modes.

In cycle I, the memory cell selected in a first half period T1 is in the state of low resistance value Rmin, and a drop amount of voltage level of internal data line IOa is small, and L level data is read. In this data reading, if the activation timing of output buffer 120 is the same as the normal data reading timing, data reading can be performed at the similar timing as a reading mode of a prescribed normal operation, according to data latched by latch circuit 153.

In this cycle I, when the read-modify-write mode is instructed according to command CMD, selector 162 selects internal read data from selector 155 and supplies the selected one to write related circuit 102, according to mode instructing signal MOD from write control circuit 108. In this case, data writing is performed in accordance with internal read data in place of externally applied data D.

In cycle II, the data read mode is designated according to an externally supplied command. In this case, data write is not performed, and demultiplexer 150 selects internal read data from read related circuit 104 and transmits it to read amplifier 152. Read amplifier 152 performs an amplifying operation at the same timing as in a normal read mode, and latch 154 latches output data from read amplifier 152. Selector 155 selects data of latch 154 and applies it to output buffer 120. Accordingly, in this case also, external data is read at the same timing as a normal operation timing. In this cycle, the selected memory cell is in the state of high resistance value Rmax, a voltage drop amount of read bit line RBL from the precharge voltage level is small, and accordingly, a potential drop of internal read data line IOa is large, and H level data is output externally.

Again, in clock cycle III, a data write instruction and a data read instruction are supplied concurrently. In this case, similarly to clock cycle I, demultiplexer 150 applies internal read data from read related circuit 104 to read amplifier 151, and data read in first half cycle T5 is applied to latch circuit 153. After this data reading is completed in first half cycle T5, in second half cycle T6, data writing is performed according to an externally applied address signal, and a write current is supplied to digit line DL and write bit line WBL in memory block #A, to perform data writing. In memory block #B, in order to read out reference cell data, word line WL is driven to a selected state.

In clock cycle IV, this non-volatile semiconductor memory device is in standby state, and data access is not made.

In clock cycle V, when only data writing is instructed, write control circuit 108 causes selector 162 to select an output signal of input latch 114. Cell write adjust circuit 160 determines match/mismatch of the logic levels between data selected by selector 162 and memory cell data read first in first half cycle T7. When cell write adjust circuit 160 determines that the read out memory cell data is the same as the write data, the data writing from that timing onward is prohibited, and data writing in second half cycle T8 is stopped. In FIG. 29, the data of selected memory cell in specified memory cell block #B is the data corresponding to high resistance state Rmax, and the voltage level of internal read data line IOb is lower than reference value Va. Thus, data writing is not performed, as the externally applied write data matches in logic level internal read data.

When this data writing is instructed, in case of mismatch of logic levels, the write-verify-read operation is performed according to an externally applied write data (see the fourth embodiment).

As above, when data writing and reading are performed in parallel, a data reading operation is performed in the first half period of a clock cycle, and data writing is performed in the second half period. Thus, data writing and reading can be performed in the same cycle, and operation modes of read-modify-write and write-verify read can be implemented.

Figure 30:
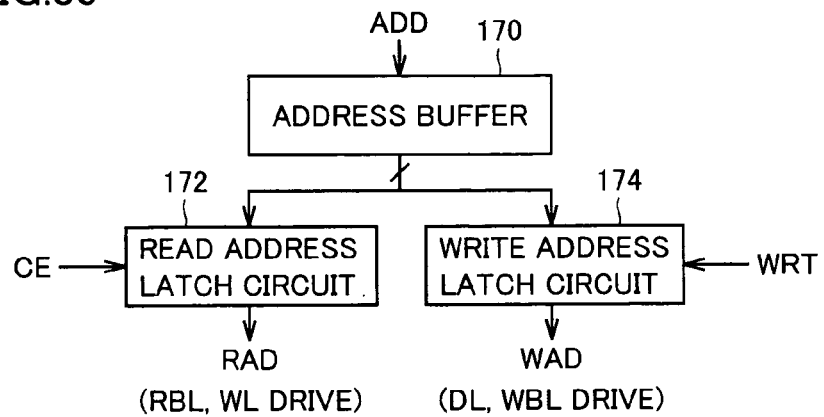
FIG. 30 schematically shows a configuration of a portion for generating an internal address of the non-volatile semiconductor memory device according to the fifth embodiment of the present invention.

FIG. 30 schematically shows a configuration of an internal address generating portion of the non-volatile semiconductor memory device according to the fifth embodiment of the present invention. In FIG. 30, the internal address generating portion includes an address buffer 170 for buffering an externally applied address signal ADD to generate an internal address, a write address latch circuit 174 for latching, in data writing, the internal address signal from address buffer 170 according to write latch instruct signal WRT from write control circuit 108 shown in FIG. 28, to generate write address signal WAD, and a read address latch circuit 172 for taking in and latching the address signal from address buffer 170, upon data access to this non-volatile semiconductor memory device, in accordance with access instruct signal CE, to generate an internal read address signal RAD.

Internal read address signal RAD from read address latch circuit 172 is applied to the circuitry for driving read bit line RBL and word line WL. Internal write address signal WAD from write address latch circuit 174 is applied to the circuitry for driving digit line DL and write bit line WDL.

Figure 31:
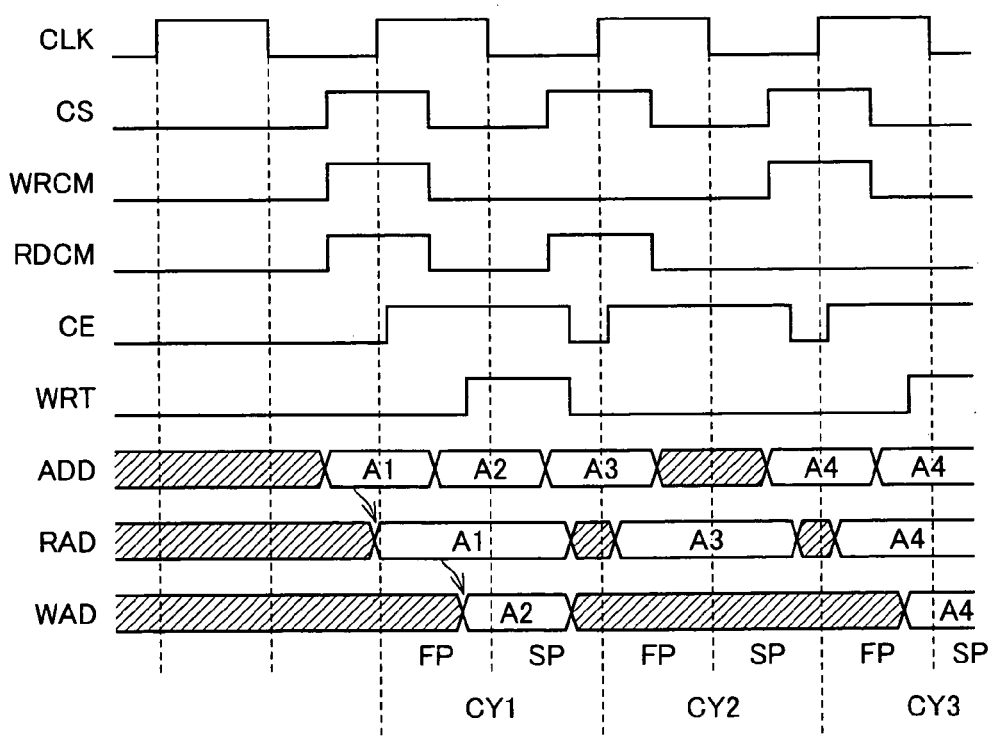
FIG. 31 is a timing diagram representing an operation of the internal address generation portion shown in FIG. 30.

FIG. 31 is a signal waveform diagram representing an operation of the internal address generating portion shown in FIG. 30. In the following, a configuration of the internal address generating portion shown in FIG. 30 is described with reference to FIG. 31.

In clock cycle CY1, external command CS, WRCM and RDCM is supplied, and a data write instruction and a data read instruction are supplied simultaneously. In accordance with chip select signal CS, access instruct signal CE is activated, and read address latch circuit 172 takes in address signal A1 applied from address buffer 170 and generates internal read address signal RAD according to the rising edge of clock signal CLK.

On the other hand, write address latch circuit 174 latches internal address signal A2 from address buffer 170 according to activation of latch instruct signal WRT in clock cycle CY1, and generates internal write address signal WAD in second half period SP of clock cycle CY1. Latch instruct signal WRT is activated after first half period FP is completed. The internal address signal may be generated (set to a definite state) synchronously with the falling edge of clock signal CLK.

Accordingly, when both data reading and writing are instructed, first, memory cell selection and data reading are performed according to address signal A1, and subsequently, memory cell selection and data writing are performed according to address signal A2.

In clock cycle CY2, according to commands CS and RDCM, data reading is instructed. When this clock cycle CY is completed, access instruct signal CE and write latch signal WRT has already been driven to inactive state, and read address latch circuit 172 and write address latch circuit 174 are set to an initialized state (or set to through state).

In clock cycle CY2, synchronously with the rising edge of clock signal CLK, according to chip select signal CS, access instruct signal CE is activated and read address latch circuit 172 takes in and latches address signal A3 from address buffer 170, to generate internal read address signal RAD according to address signal A3. As data writing is not performed in read cycle period, over first half period YP and second half period SP of cycle CY2, read address signal RAD is in a definite state. On the other hand, write address signal WAD is in arbitrary state (don't care state) as write address latch circuit 174 is in inactive state (or through state). Even when write address latch circuit 174 is in through state, it would not cause a problem, since the write related circuit does not operate.

In clock cycle CY3, data writing is instructed according to externally supplied command CS and WRCM. In this data writing, first, access instruct signal CE is activated according to chip select signal CS, and read address latch circuit 172 takes in and latches address signal A4 from address buffer 170 to generate internal read address signal RAD.

Then, in second half period SP of clock cycle CY3, write address latch circuit 174 performs a latch operation according to latch instructing signal WRT to generate write address signal WAD according to address signal A4 from address buffer 170. When only data writing is instructed in clock cycle CY3, read address signal RAD and write address signal WAD is the same address signal A4. In this case, memory cell data read from the same address as the memory cell of write target is compared with write data, and based on the comparison result, data writing in second half period SP is selectively performed.

It is noted that, when address signals A1 and A2 are different in clock cycle CY1, the read-modify-write operation may be designated. For designating this read-modify-write operation, another signal is used. In this case, a configuration using a specific bit of write data D may be used. Further, the read-modify mode may constantly be designated as default, when data writing and data reading are instructed simultaneously. In addition, this operation mode may be specified by storing a mode instruct signal in a specific mode register circuit. For storing a mode instruct signal in a mode register circuit, a specific command such as a mode register set command may be used.

When address signals A1 and A2 are the same address signal in clock cycle CY1, similarly, data writing in second half period SP of clock cycle CY1 may be selectively stopped based on the comparison of write data and internal read data. For implementing this configuration, a configuration may be employed, in which whether address signals A1 and A2 are the same is determined using address transition detecting circuit (ATD circuit) detecting address transition, and when they are the same address signal, cell write adjust circuit 160 shown in FIG. 28 is activated and determination of match/mismatch of logic levels of write data and internal read data is performed.

In the configuration shown in FIG. 30, the write address and the read address are applied through a common address buffer 170. However, when the non-volatile semiconductor memory device is formed on the same semiconductor chip as a processor, for example, and an address signal input port does not suffer from the restrictive effect of chip pin terminals, read address signal and a write address signal may be applied to the read address latch circuit and write address latch circuit 174 respectively via separate paths and buffer circuits. In this case, an address signal line is an on-chip line, and a write address signal and a read address signal can be transferred via separate signals lines from a memory controller or a processor, without taking into account a interconnection layout area. When the write address signal and the read address signal are transferred via separate paths, the latch timing of read address signal and write address signal can be set to the same timing to adjust only start timings of internal read operation and internal write operation. Thus, internal operation timing control can be simplified.

As described above, according to the fifth embodiment of the present invention, the time periods in a cycle for performing data reading and writing are adjusted, commands instructing external data writing and external data reading can be supplied in the same cycle to perform data writing and data reading, and two instructions can be executed in one cycle. Thus, the processing performance can be improved.

Further, by realizing the read-modify-write operation or the read-verify-write mode internally, the current consumption in writing can be reduced, and correct writing can be achieved.

The present invention is generally applicable to a non-volatile semiconductor memory device. Particularly, by applying the present invention to a non-volatile semiconductor memory device that employs a variable resistance element such as a TMR element or a phase change element as a memory element, a semiconductor memmory device that can perform fast accessing with small current consumption can be provided.

Further, the configuration where a write bit line and a read bit line are separately provided to perform data writing and data reading internally in a time-division multiplexed manner is not limitedly applied to a memory cell using a magneto-resistance element, but can be applied to a non-volatile semiconductor memory device that uses phase change element, and a non-volatile semiconductor memory device that uses a threshold voltage change type memory cell storing data by accumulating charges in an insulating film or accumulating charges in the floating gate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:
    a plurality of non-volatile memory cells, arranged in rows and columns, each having physical state thereof set according to storage information and storing information in a non-volatile manner based on said physical state;
    a write circuit for supplying, in data writing, a write current to a write target memory cell among said plurality of non-volatile memory cells, to perform data writing to said write target memory cell; and
    a read circuit for performing data reading from a read target memory cell among said plurality of non-volatile memory cells, said read circuit operable concurrently with said write circuit, said read circuit performing data reading after activation of said write circuit, with said write target memory cell being said read target memory cell, concurrently with writing by said write circuit within a common operation cycle.

2. A non-volatile semiconductor memory device comprising:
    a plurality of non-volatile memory cells, arranged in rows and columns, each having physical state thereof set according to storage information and storing information in a non-volatile manner based on said physical state;
    a write circuit for supplying, in data writing, a write current to a write target memory cell among said plurality of non-volatile memory cells, to perform data writing to said write target memory cell;
    a read circuit for performing data reading from a read target memory cell among said plurality of non-volatile memory cells, said read circuit operable concurrently with said write circuit;
    a plurality of write bit lines, arranged corresponding to memory cell columns, each for supplying a first write current from said write circuit to the memory cells on a corresponding column; and
    a plurality of read bit lines, arranged separately from the write bit lines and corresponding to the memory cell columns, for supplying a read current for reading data of the read target memory cell from said read circuit,
    said write circuit performing data writing, after activation of said read circuit, with said read target memory cell being said write target memory cell, concurrently with reading by said read circuit, the reading and writing operations being repeated while supplying the read current to the read bit line of the read target memory cell until data read by said read circuit coincides with write data of said write circuit.

* * * * *